United States Patent
Pike et al.

(10) Patent No.: US 10,536,303 B1
(45) Date of Patent: Jan. 14, 2020

(54) QUARTER-RATE CHARGE-STEERING DECISION FEEDBACK EQUALIZER (DFE) TAPS

(71) Applicants: Jacob Pike, Almonte (CA); Mahdi Parvizi, Kanata (CA); Naim Ben-Hamida, Nepean (CA); Sadok Aouini, Gatineau (CA); Calvin Plett, Ottawa (CA)

(72) Inventors: Jacob Pike, Almonte (CA); Mahdi Parvizi, Kanata (CA); Naim Ben-Hamida, Nepean (CA); Sadok Aouini, Gatineau (CA); Calvin Plett, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 16/203,101

(22) Filed: Nov. 28, 2018

(51) Int. Cl.
*H04L 25/03* (2006.01)
*H03K 3/356* (2006.01)

(52) U.S. Cl.
CPC .. *H04L 25/03063* (2013.01); *H04L 25/03025* (2013.01); *H04L 25/03267* (2013.01); *H03K 3/356139* (2013.01); *H04L 25/03878* (2013.01)

(58) Field of Classification Search
USPC ........................................................ 375/233
See application file for complete search history.

(56) References Cited

U.S. PATENT DOCUMENTS

| | | | |
|---|---|---|---|
| 6,275,107 B1 | 8/2001 | Maeda et al. | |
| 9,106,461 B2 | 8/2015 | Parikh | |
| 9,148,316 B2 | 9/2015 | Mukherjee | |
| 9,531,570 B2 | 12/2016 | Hekmat et al. | |
| 2008/0310495 A1 | 12/2008 | Bulzacchelli et al. | |
| 2016/0080178 A1* | 3/2016 | Chen | H04L 25/03057 375/233 |
| 2016/0344576 A1* | 11/2016 | Francese | H04L 25/03057 |
| 2017/0264467 A1* | 9/2017 | Neto | H04L 25/03057 |
| 2017/0373889 A1* | 12/2017 | Sakai | H04L 25/03057 |

(Continued)

OTHER PUBLICATIONS

Jung, "A 25-Gb/s 5-mW CDR/Deserializer in 65-nm Technology", UCLA Electronic Theses and Dissertations, 2012.

(Continued)

*Primary Examiner* — Eva Y Puente
(74) *Attorney, Agent, or Firm* — Integral Intellectual Property Inc.; Miriam Paton; Amy Scouten

(57) ABSTRACT

A decision feedback equalizer (DFE) comprises two charge-steering (CS) input latches driven by complementary ½-rate clocks, two pairs of CS primary latches, and two pairs of taps. The primary latches are driven by ¼-rate clocks. In a first aspect, each one of the input latches and the primary latches includes a respective differential pair of n-channel output transistors, and each tap includes a respective differential pair of p-channel input transistors. In a second aspect, each one of the input latches and the primary latches includes a respective differential pair of p-channel input transistors, and each tap includes a respective differential pair of n-channel output transistors. In some implementations, no element of any one of the taps is driven by any ½-rate clock. In some implementations, every switch of at least one of the taps is driven by one of the ¼-rate clocks.

20 Claims, 17 Drawing Sheets

(56) References Cited

U.S. PATENT DOCUMENTS

2018/0302070 A1  10/2018  Parvizi et al.

OTHER PUBLICATIONS

Jung, et al., "A 25-Gb/s 5-mW CMOS CDR/Deserializer", IEEE Journal of Solid-State Circuits, vol. 48, No. 3, Mar. 2013.

Manian, et al., "A 32-Gb/s 9.3-mW CMOS Equalizer with 0.73-V Supply", Proceedings of the IEEE 2014 Custom Integrated Circuits Conference, Sep. 2014.

Manian, "Low-Power Techniques for CMOS Wireline Receivers", UCLA Electronic Theses and Dissertations, 2016.

Emami-Neyestanak, et al., "A 6.0-mW 10.0-Gb/s Receiver With Switched-Capacitor Summation DFE", IEEE Journal of Solid-State Circuits, vol. 42 (2007): pp. 889-896.

Frans, et al., "A 40-to-64Gb/s NRZ transmitter with supply-regulated front-end in 16nm FinFET", IEEE Journal of Solid-State Circuits, vol. 51, No. 12, Dec. 2016.

Fukuda, et al., "A 12.3-mW 12.5-Gb/s Complete Transceiver in 65-nm CMOS Process", IEEE Journal of Solid-State Circuits, vol. 45, No. 12, Dec. 2010.

Jung, et al., "A 25 Gb/s 5.8 mW CMOS Equalizer", IEEE Journal of Solid-State Circuits, vol. 50, No. 2, Feb. 2015.

Jung, et al., "A 25-Gb/s 5-mW CMOS CDR/Deserializer", 2012 Symposium on VLSI Circuits Digest of Technical Papers, 138-139.

Manian, et al., "A 40Gb/s 14mW CMOS Wireline Receiver", 2016 IEEE International Solid-State Circuits Conference.

Manian, et al., "A 40-Gb/s 14-mW CMOS Wireline Receiver", IEEE Journal of Solid-State Circuits, vol. 52, No. 9, Sep. 2017.

Manian, et al., "A 40-Gb/s 9.2-mW CMOS Equalizer", 2015 Symposium on VLSI Circuits Digest of Technical Papers.

Parikh, et al., "A 32Gb/s wireline receiver with a low-frequency equalizer, CTLE and 2-tap DFE in 28nm CMOS", Paper presented at the meeting of the ISSCC, 2013, 2013.

Pike, et al., "New Charge-Steering Latches in 28nm CMOS for Use in High-Speed Wireline Transceivers", 2018 IEEE International Symposium on Circuits and Systems (ISCAS), May 2018.

Razavi, "Charge Steering: A Low-Power Design Paradigm", Proceedings of the IEEE 2013 Custom Integrated Circuits Conference (2013): 1-8.

Toifl, et al., "A 2.6 mW/Gbps 12.5 Gbps RX With 8-Tap Switched-Capacitor DFE in 32 nm CMOS", IEEE Journal of Solid-State Circuits, vol. 47, Issue 4, Apr. 2012.

Turker, et al., "Design techniques for 32.75Gb/s and 56Gb/s wireline transceivers in 16nm FinFET", 2017 IEEE Compound Semiconductor Integrated Circuit Symposium (CSICS), Oct. 2017.

Wong, et al., "A 5-mW 6-Gb/s Quarter-Rate Sampling Receiver With a 2-Tap DFE Using Soft Decisions", IEEE Journal of Solid-State Circuits, vol. 42, No. 4, Apr. 2007.

Phu, "Notice of Allowance for U.S. Appl. No. 16/379,502", dated Oct. 23, 2019.

\* cited by examiner

US 10,536,303 B1

QUARTER-RATE CHARGE-STEERING DECISION FEEDBACK EQUALIZER (DFE) TAPS

TECHNICAL FIELD

This document relates to the technical field of decision feedback equalizers (DFEs).

BACKGROUND

As data is transmitted over a channel from a serializer device to a deserializer device, loss in the channel results in the amplitude being attenuated and inter-symbol interference (ISI). These issues are exacerbated as data transmission speeds increase.

An important element of the deserializer device is a decision feedback equalizer (DFE). A DFE processes an input stream $D_{IN}$ of data to yield an output stream $D_{OUT}$ of data. The input stream $D_{IN}$ represents input bits $\{b_1, b_2, b_3, \ldots\}$, and the output stream $D_{OUT}$ represents output bits $\{B_1, B_2, B_3, \ldots\}$. To compensate for the ISI, the DFE adjusts each input bit using N previous output bits to yield the corresponding output bit, where N is a positive integer. Mathematically, this is expressed as $$B_{N+1} = b_{N+1} + \sum_{k=1}^{N} \alpha_k B_k$$

where the coefficients $\alpha_k$ express the strength of the contribution of the kth previous output bit $B_k$ to the adjustment.

More specifically, the DFE adjusts the voltages representing each input bit by the voltages representing N previous output bits to yield voltages representing the corresponding output bit.

N latches of the DFE store the N previous output bits. Each one of N taps determines the coefficient α that expresses the strength of the adjustment contributed by a corresponding one of the previous output bits. A summing node of the DFE samples the input bit and adds the adjustments to the sampled input bit.

It is common to implement the latches of a DFE using current mode logic (CML). K-L J. Wong, A. Rylyakov, and C-K K. Yang, "A 5-mW 6-Gb Quarter-Rate Sampling Receiver With a 2-Tap DFE Using Soft Decisions", *IEEE Journal of Solid-State Circuits*, vol. 42, no. 4, April 2007 describes using a quarter-rate CML-based DFE to make clock generation and distribution simpler.

B. Ravazi has shown in "Charge Steering: A Low-Power Design Paradigm", *Custom Integrated Circuits Conference*, pp. 1-8, September 2013 that latches based on charge-steering (CS) techniques demonstrate power savings of approximately 4.4 times the CML latches.

The CS equalizers described in A. Manian and B. Razavi, "A 40-Gb/s 14-mW CMOS Wireline Receiver", *IEEE Journal of Solid-State Circuits*, vol. 52, no. 9, September 2017, require extensive distribution of half-rate clocks, which make their design inappropriate for pushing data transmission speeds.

SUMMARY

Charge-steering taps having simplified clock routing and lower power consumption are presented.

DETAILED DESCRIPTION

Figure 1:
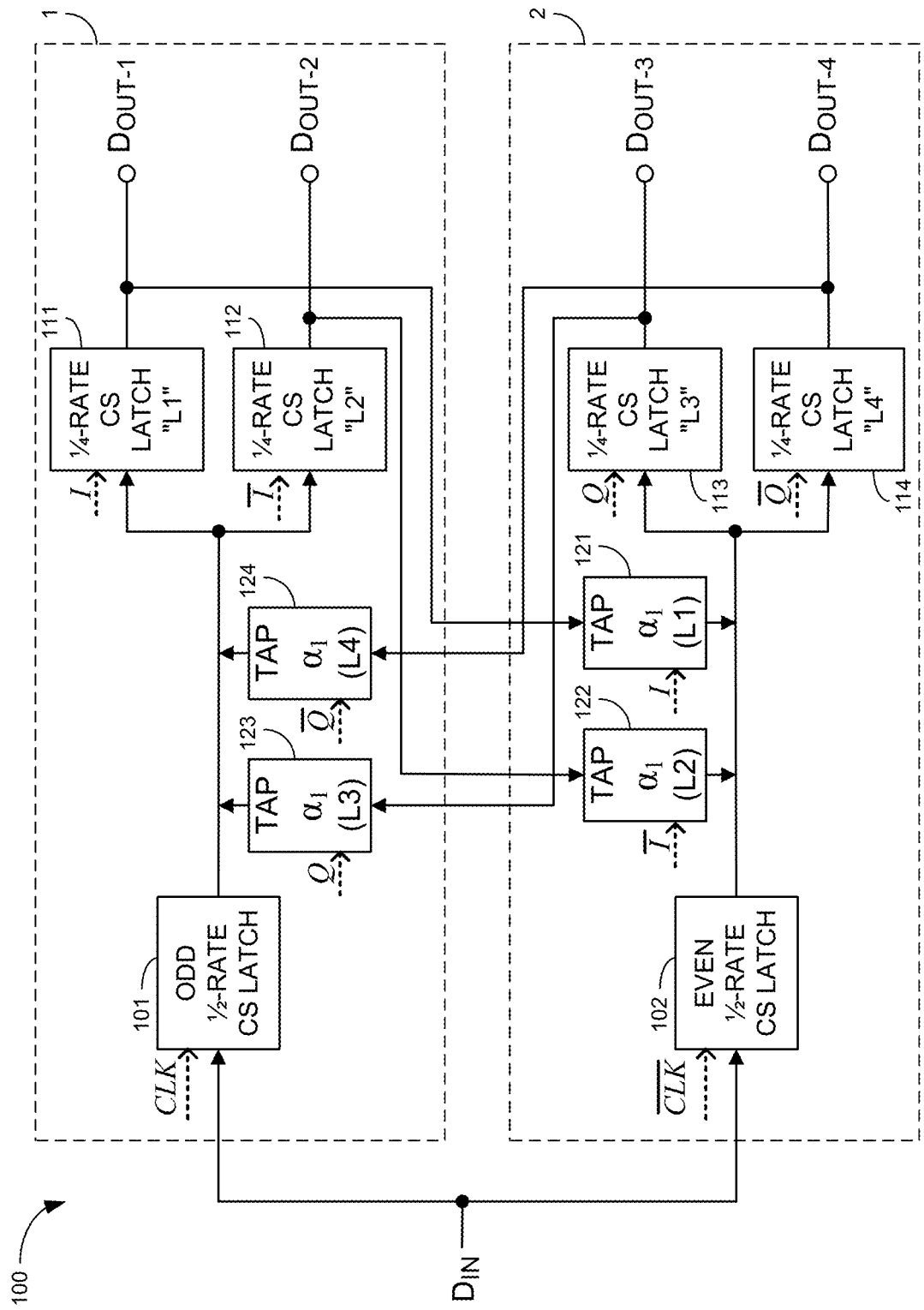
FIG. 1 is a schematic diagram of an example one-tap ½-rate charge-steering (CS) decision feedback equalizer (DFE)
Figure 2:
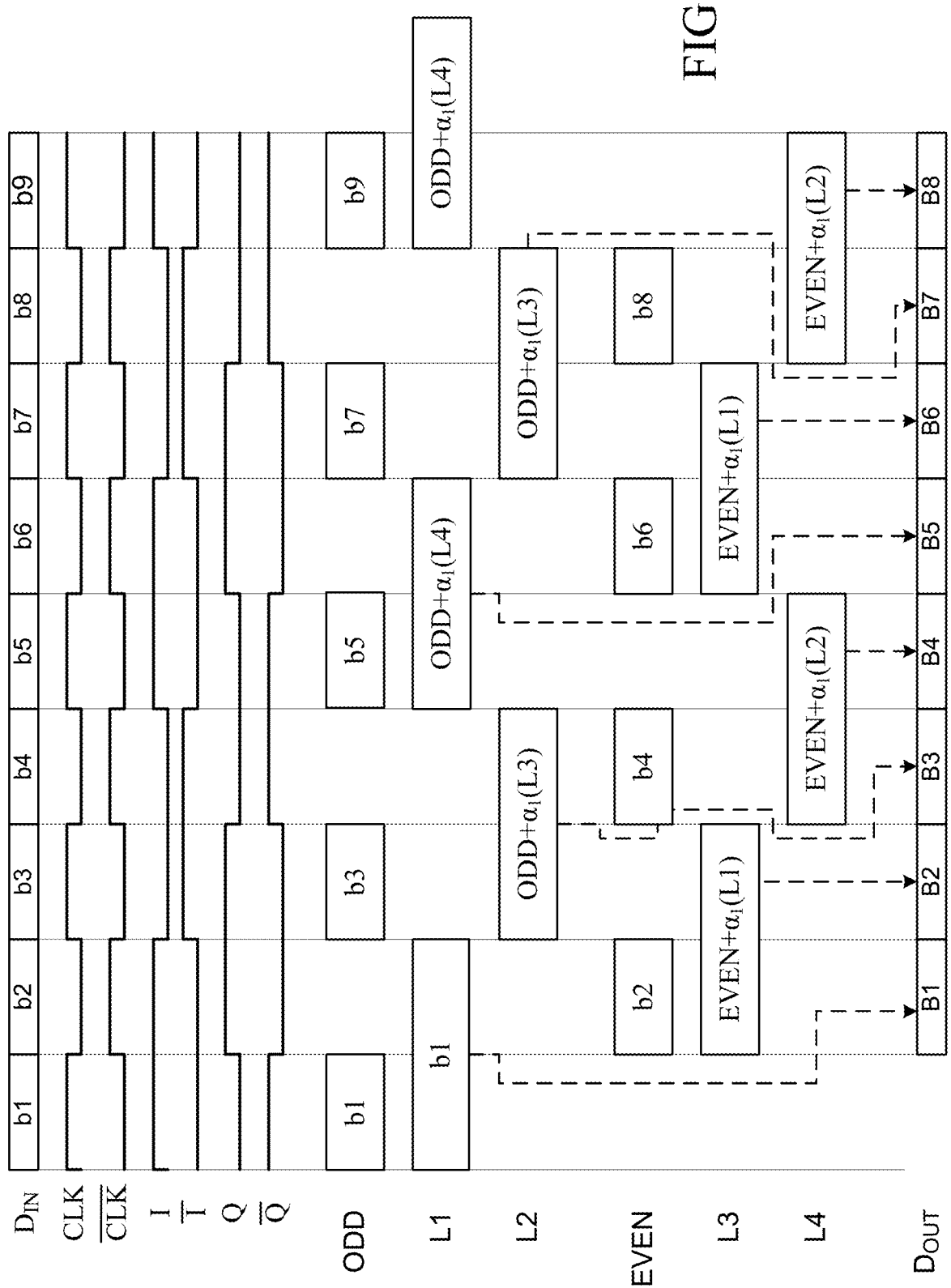
FIG. 2 and FIG. 3 are example timing diagrams of an input data stream, an output data stream, various ½-rate and ¼-rate clocks, and the state of various elements in the example one-tap ½-rate CS DFE of FIG. 1.
Figure 3:
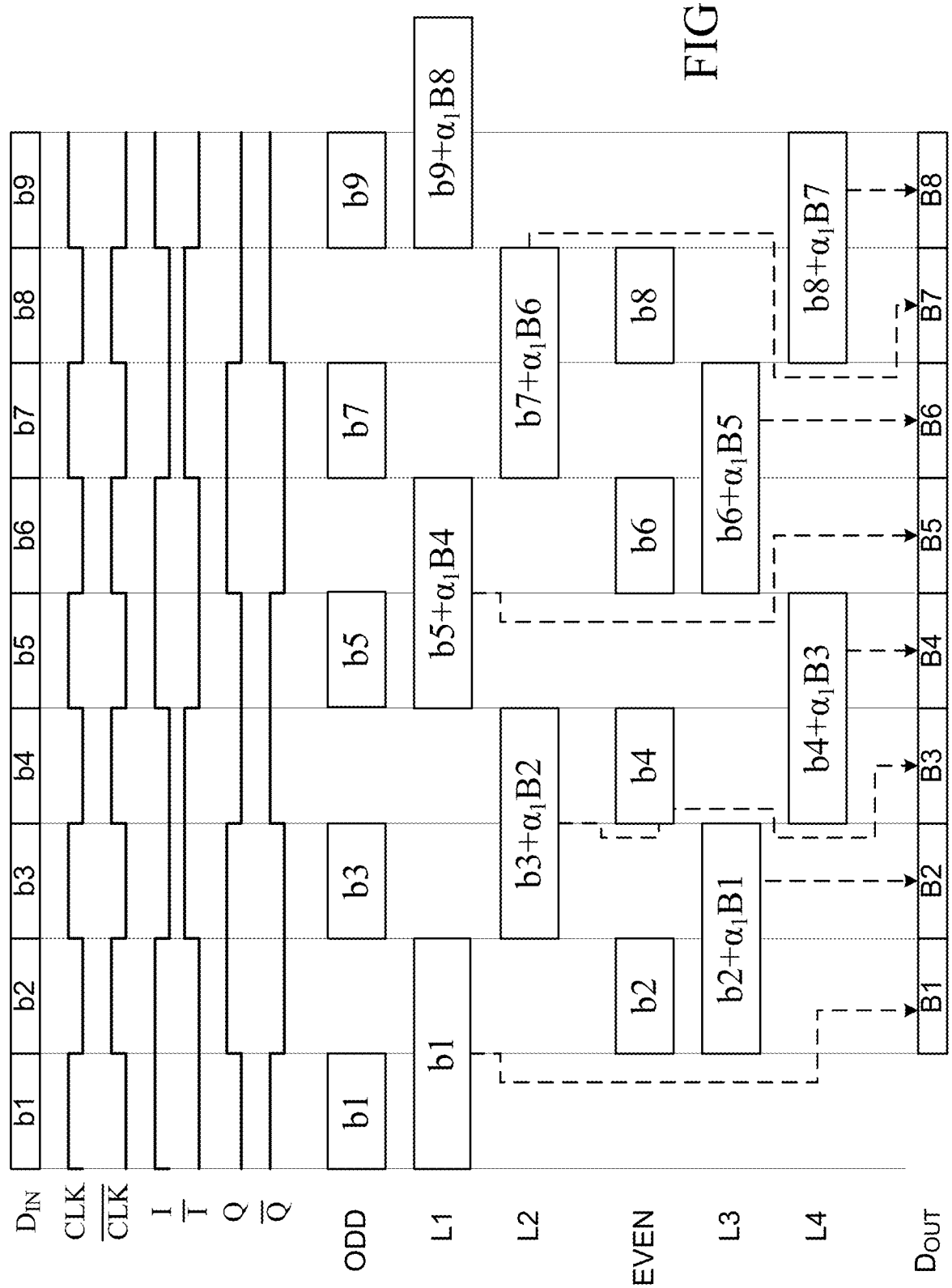

FIG. 1 is a schematic diagram of an example one-tap ½-rate charge-steering (CS) decision feedback equalizer (DFE) 100. FIG. 2 and FIG. 3 are example timing diagrams of an input data stream, an output data stream, various ½-rate and ¼-rate clocks, and the state of various elements in the DFE 100.

The DFE 100 comprises multiple charge-steering (CS) latches. Each CS latch is driven by a clock. The CS latch is in its reset mode when the clock that drives the CS latch is low, and the CS latch is in its evaluation mode and samples its input and holds the sampled value when the clock that drives the CS latch is high.

An analog input data stream $D_{IN}$ conveys data at a data rate R, for example, at 56 Gb/s or at 112 Gb/s or higher. Components of the DFE 100 are driven by clocks. Input data has a data rate given in bits per second, but its highest possible frequency component, given in Hertz, is half the data rate. A ½-rate clock is the same speed as the data rate if there is a transition every bit. A ¼-rate clock is twice as slow as the data rate. Stated differently, if a data rate represents different data at a max frequency f, then a ½-rate clock changes its state at the frequency f and a ¼-rate clock changes its state at the frequency ½f.

The following clocks are employed: complementary ½-rate clocks labeled CLK and $\overline{\text{CLK}}$, an in-phase ¼-rate clock labeled I that is in-phase with CLK (that is, a rising edge of I coincides with a rising edge of CLK), a quadrature ¼-rate clock labeled Q that is 90° out of phase with I (that is, a rising edge of Q coincides with a rising edge of $\overline{\text{CLK}}$), a ¼-rate clock labeled $\overline{\text{I}}$ that is complementary to I, and a ¼-rate clock labeled $\overline{\text{Q}}$ that is complementary to Q. When one of the ½-rate clocks is high, the other ½-rate clock is low, and vice versa.

The DFE 100 comprises an "odd" input latch 101 and an "even" input latch 102. The odd input latch 101 is a CS latch driven by CLK that samples the input data stream $D_{IN}$ when CLK is high. The even input latch 102 is a CS latch driven by $\overline{\text{CLK}}$ that samples the input data stream $D_{IN}$ when $\overline{\text{CLK}}$ is high. Input latches 101 and 102 may be referred to as ½-rate CS latches, because they are driven by ½-rate clocks. As illustrated in FIG. 2 and FIG. 3, if the input data stream $D_{IN}$ represents bit values denoted $\{b_1, b_2, b_3, \ldots\}$, then the odd input latch 101 successively holds the bit values denoted $\{b_1, b_3, b_5, \ldots\}$, and the even input latch 102 successively holds the bit values denoted $\{b_2, b_4, b_6, \ldots\}$.

The DFE 100 comprises four ¼-rate CS latches 111 through 114 (labeled "L1" through "L4", respectively). In this document, the latches L1 through L4 are referred to as "primary latches".

The line connecting the output of the even input latch 102 to the input of the primary latch L3 and to the input of the primary latch L4 is affected by primary taps 121 and 122 characterized by a real-valued coefficient $\alpha_1$.

The primary tap 121 is coupled to the output of the primary latch L1, and the primary tap 122 is coupled to the output of the primary latch L2. When I is high, the primary latch L2 is in its reset mode, and the primary latch L1 holds a value. When $\overline{\text{I}}$ is high, the primary latch L1 is in its reset mode, and the primary latch L2 holds a value. Accordingly, when I is high, the primary tap 121 provides a product of the coefficient $\alpha_1$ and the value held in the primary latch L1, and when $\overline{\text{I}}$ is high, the primary tap 122 provides a product of the coefficient $\alpha_1$ and the value held in the primary latch L2.

The line connecting the output of the odd input latch 101 to the input of the primary latch L1 and to the input of the primary latch L2 is affected by primary taps 123 and 124 characterized by the coefficient $\alpha_1$.

The primary tap 123 is coupled to the output of the primary latch L3, and the primary tap 124 is coupled to the output of the primary latch L4. When Q is high, the primary latch L4 is in its reset mode, and the primary latch L3 holds a value. When $\overline{\text{Q}}$ is high, the primary latch L3 is in its reset mode, and the primary latch L4 holds a value. Accordingly, when Q is high, the primary tap 123 provides a product of the coefficient $\alpha_1$ and the value held in the primary latch L3, and when $\overline{\text{Q}}$ is high, the primary tap 124 provides a product of the coefficient $\alpha_1$ and the value held in the primary latch L4.

When I is high, the primary tap 121 contributes to the input of the primary latch L3. When $\overline{\text{I}}$ is high, the primary tap 122 contribute to the input of the primary latch L4. When Q is high, the primary tap 123 contributes to the input of the primary latch L2. When $\overline{\text{Q}}$ is high, the primary tap 124 contributes to the input of the primary latch L1. The DFE 100 is denoted a one-tap CS DFE because at any given time, one tap contributes to the input of a primary latch.

The primary latch L1 is driven by I. When I is high and CLK is high, the value sampled by the primary latch L1 is the sum of the value held in the odd input latch 101 and the value provided by the primary tap 124. That is, L1=ODD+$\alpha_1$L4. When I is high and $\overline{\text{CLK}}$ is high, the value held in the primary latch L1 becomes part of the output data stream $D_{OUT\text{-}1}$.

The primary latch L2 is driven by $\overline{\text{I}}$. When $\overline{\text{I}}$ is high and CLK is high, the value sampled by the primary latch L2 is the sum of the value held in the odd input latch 101 and the value provided by the primary tap 123. That is, L2=ODD+$\alpha_1$L3. When $\overline{\text{I}}$ is high and $\overline{\text{CLK}}$ is high, the value held in the primary latch L2 becomes part of the output data stream $D_{OUT\text{-}2}$.

The primary latch L3 is driven by Q. When Q is high and CLK is high, the value sampled by the primary latch L3 is the sum of the value held in the even input latch 102 and the value provided by the primary tap 121. That is, L3=EVEN+$\alpha_1$L1. When Q is high and $\overline{\text{CLK}}$ is high, the value held in the primary latch L3 becomes part of the output data stream $D_{OUT\text{-}3}$.

The primary latch L4 is driven by $\overline{\text{Q}}$. When $\overline{\text{Q}}$ is high and CLK is high, the value sampled by the primary latch L4 is the sum of the value held in the even input latch 102 and the value provided by the primary tap 122. That is, L4=EVEN+$\alpha_1$L2. When $\overline{\text{Q}}$ is high and $\overline{\text{CLK}}$ is high, the value held in the primary latch L4 becomes part of the output data stream $D_{OUT\text{-}4}$.

If the input data stream $D_{IN}$ represents bit values denoted $\{b_1, b_2, b_3, \ldots\}$, the output data stream $D_{OUT}$ comprised of the output data streams $D_{OUT\text{-}1}, D_{OUT\text{-}2}, D_{OUT\text{-}3}$, and $D_{OUT\text{-}4}$ represents bit values denoted $\{B_1, B_2, B_3, \ldots\}$. The relationship between the input bit values and output bit values is summarized in Table 1:

TABLE 1

| Input Bit Value | Output Bit Value |
| --- | --- |
| $b_1$ | $B_1 = b_1$ |
| $b_2$ | $B_2 = b_2 + \alpha_1 B_1$ |
| $b_3$ | $B_3 = b_3 + \alpha_1 B_2$ |
| $b_4$ | $B_4 = b_4 + \alpha_1 B_3$ |
| $b_5$ | $B_5 = b_5 + \alpha_1 B_4$ |
| $b_6$ | $B_6 = b_6 + \alpha_1 B_5$ |
| $b_7$ | $B_7 = b_7 + \alpha_1 B_6$ |
| $b_8$ | $B_8 = b_8 + \alpha_1 B_7$ |
| ... | ... |

The DFE 100 is denoted a one-tap CS DFE because each output bit value $B_{k+1}$ is the input value $b_{k+1}$ adjusted by the nearest previous output bit value $B_k$. The coefficient $\alpha_1$ applied by the primary taps 121, 122 and by the primary taps 123, 124 expresses the strength of the adjustment that the nearest previous adjusted bit value has on the bit value currently being adjusted. For a given channel, it is expected that the coefficient $\alpha_1$ is constant or slowly varying (relative to the data rate).

The DFE 100 may be considered to have two branches: an "odd" branch 1 and an "even" branch 2. The odd branch 1 comprises the odd input latch 101, a single pair of latches (namely the primary latches L1, L2), and a single pair of taps (namely the primary taps 123, 124). The even branch 2 comprises the even input latch 102, a single pair of latches (namely the primary latches L3, L4), and a single pair of taps (namely the primary taps 121, 122).

Figure 4:
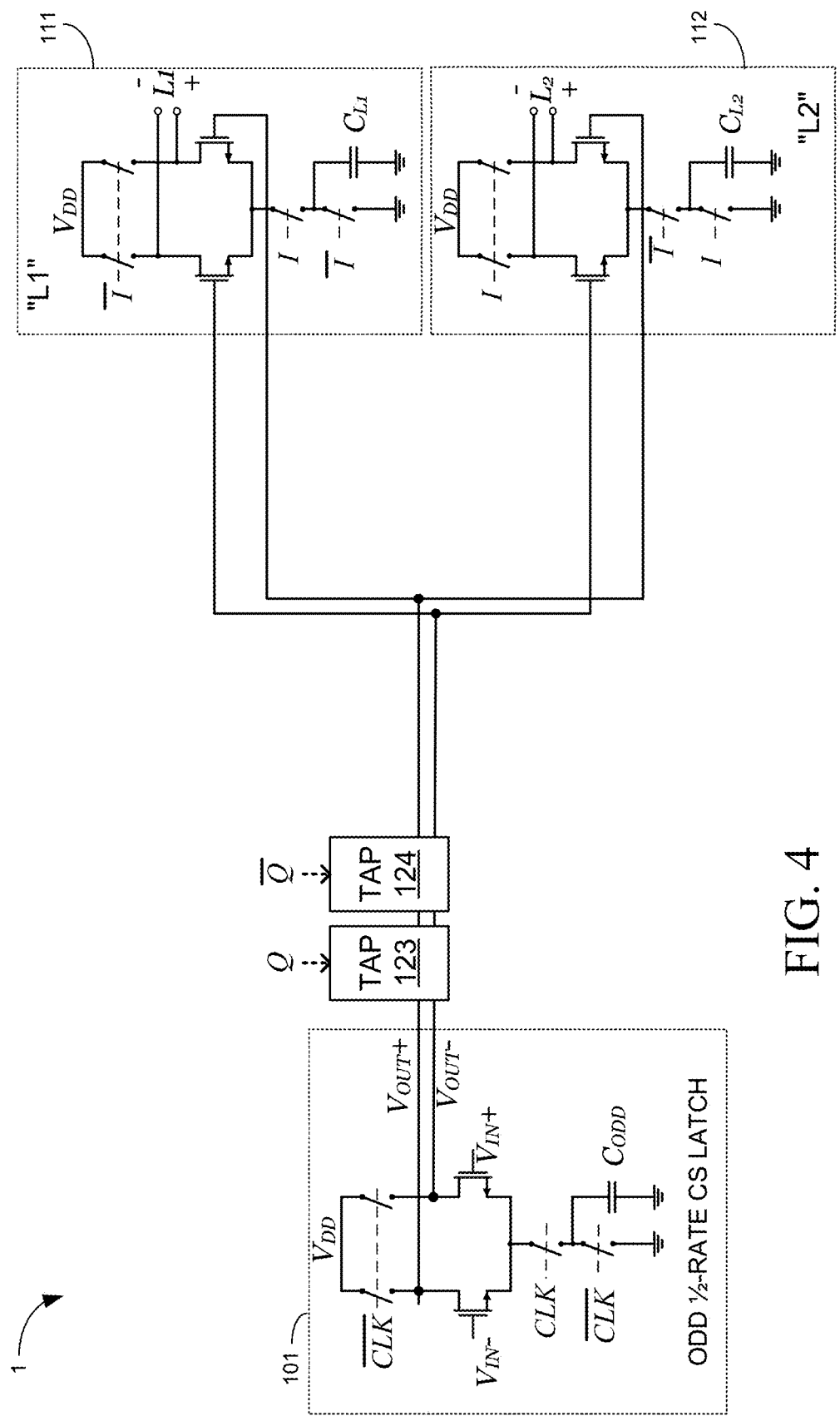
FIG. 4 is a partial circuit diagram of the "odd" branch of the example one-tap ½-rate CS DFE of FIG. 1.

FIG. 4 is a partial circuit diagram of the odd branch 1 of the DFE 100. FIG. 4 illustrates example circuitry of the odd input latch 101 and of the primary latches L1 and L2.

The odd input latch 101 comprises a differential pair of n-channel output transistors, a pair of switches driven by $\overline{\text{CLK}}$, an evaluation switch driven by CLK, a reset switch driven by $\overline{\text{CLK}}$, and a capacitor having capacitance $C_{ODD}$. The pair of switches are connected between drain nodes of the n-channel output transistors and a first power supply rail (in this example, supplying a voltage $V_{DD}$). The reset switch is connected between the evaluation switch and a second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential representation of a bit value provided by the input data stream $D_{IN}$. The drain nodes of the n-channel output transistors are connected to a differential pair of output nodes (labeled "$V_{OUT+}$" and "$V_{OUT-}$") of the odd input latch 101.

In reset mode, while CLK is low and $\overline{\text{CLK}}$ is high, the pair of switches and the reset switch are closed and the evaluation switch is open, and—in this example—the capacitor is discharged to ground. In evaluation mode, while CLK is low and $\overline{\text{CLK}}$ is high, the pair of switches and the reset switch are open and the evaluation switch is closed, and a differential swing is created between the output nodes $V_{OUT+}$ and $V_{OUT-}$.

The primary latch L1 comprises a differential pair of n-channel output transistors, a pair of switches driven by $\bar{I}$, an evaluation switch driven by I, a reset switch driven by $\bar{I}$, and a capacitor having capacitance $C_{L1}$. The pair of switches are connected between drain nodes of the n-channel output transistors and the first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential pair of output nodes of the odd input latch 101 as adjusted by the primary taps 123 and 124. The drain nodes of the n-channel output transistors are connected to a differential pair of output nodes (labeled "$L_1+$" and "$L_1-$") of the primary latch L1.

The primary latch L2 comprises a differential pair of n-channel output transistors, a pair of switches driven by I, an evaluation switch driven by $\bar{I}$, a reset switch driven by I, and a capacitor having capacitance $C_{L2}$. The pair of switches are connected between drain nodes of the n-channel output transistors and the first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential pair of output nodes of the odd input latch 101 as adjusted by the primary taps 123 and 124. The drain nodes of the n-channel output transistors are connected to a differential pair of output nodes (labeled "$L_2+$" and "$L_2-$") of the primary latch L2.

The even branch 2 of the DFE 100 has similar circuitry to the odd branch 1 of the DFE 100, differing in which clocks drive which switches.

Figure 5:
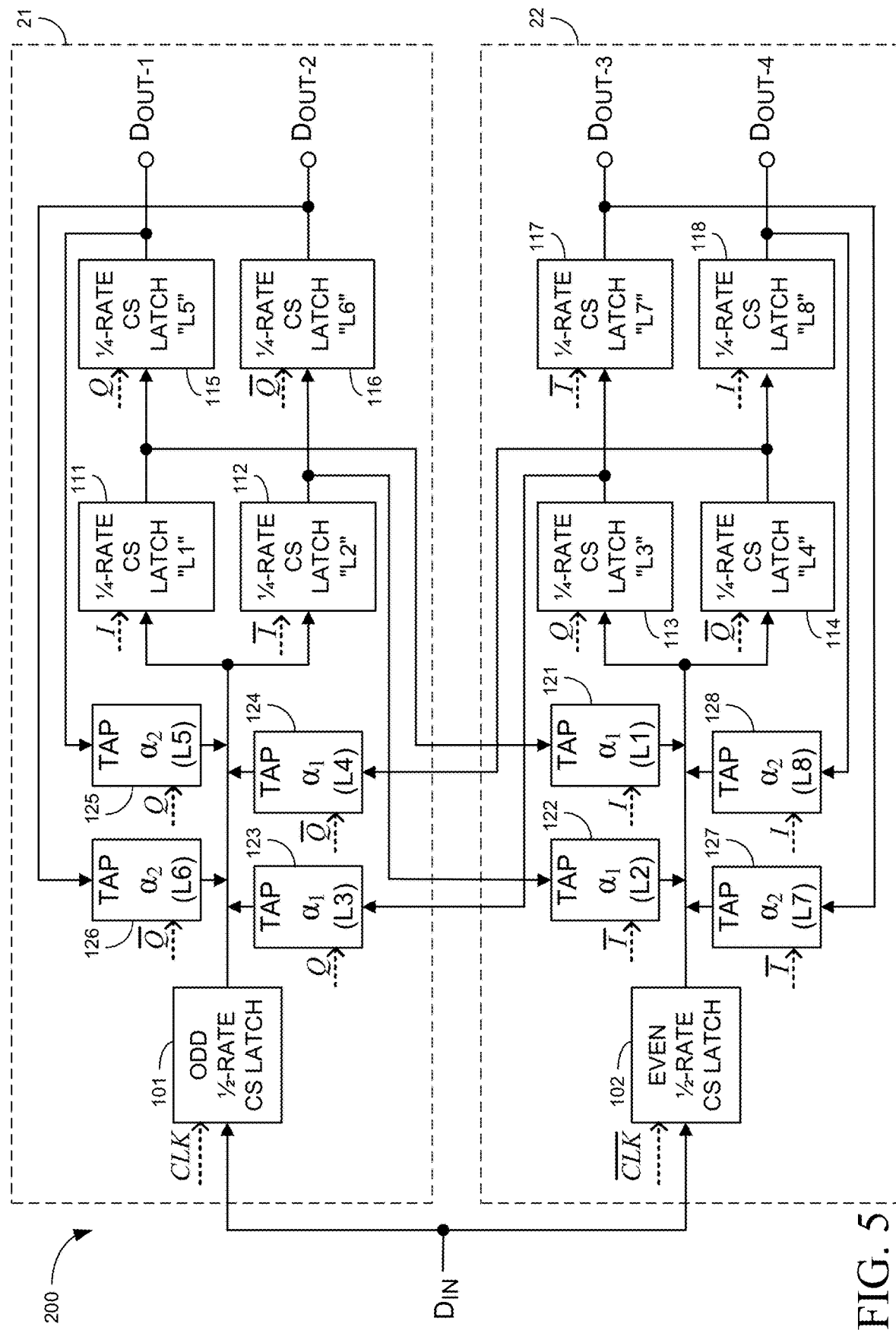
FIG. 5 is a schematic diagram of an example two-tap ½-rate charge-steering (CS) decision feedback equalizer (DFE)
Figure 6:
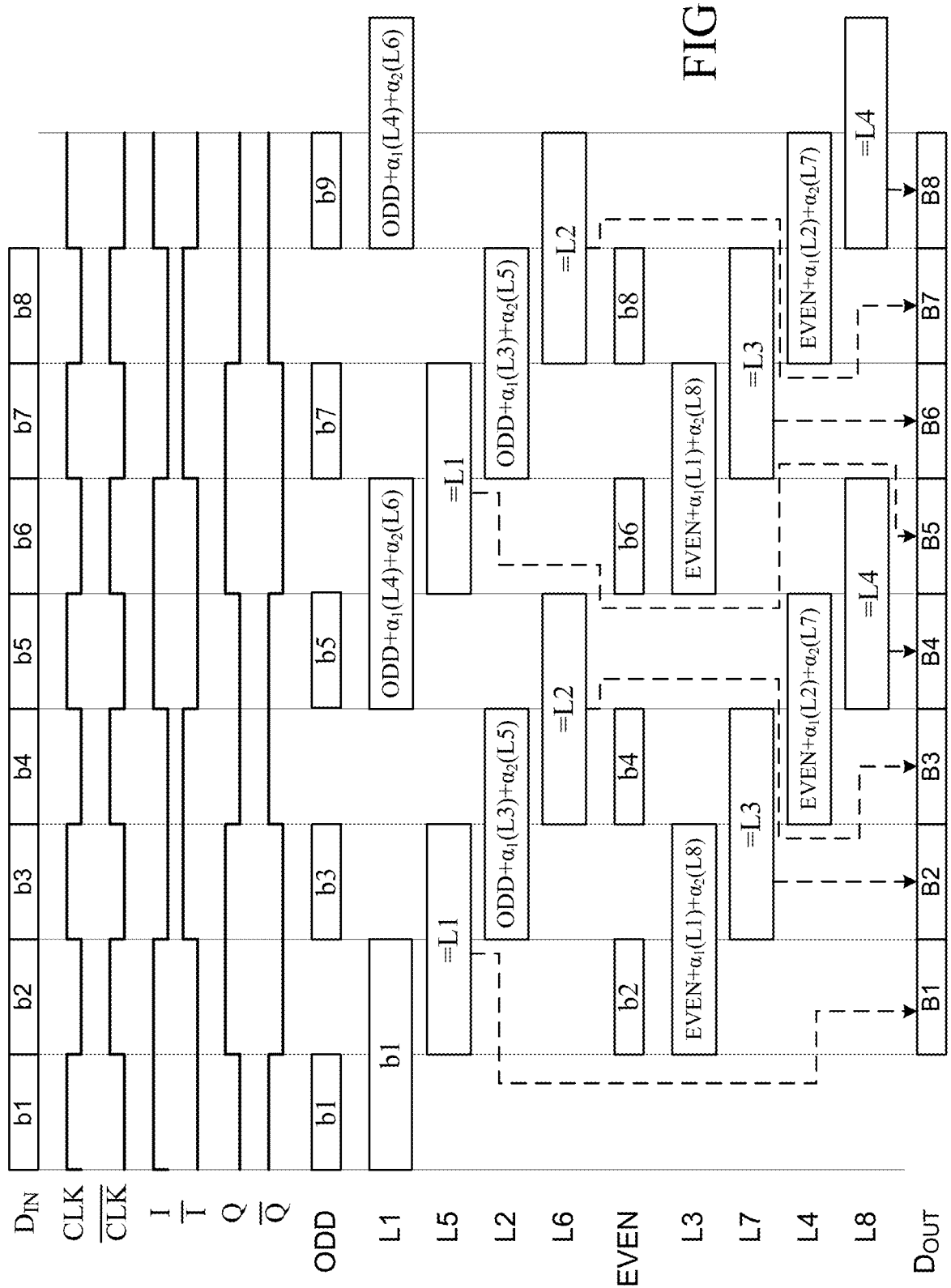
FIG. 6 and FIG. 7 are example timing diagrams of an input data stream, an output data stream, various ½-rate and ¼-rate clocks, and the state of various elements in the example two-tap ½-rate CS DFE of FIG. 5.
Figure 7:
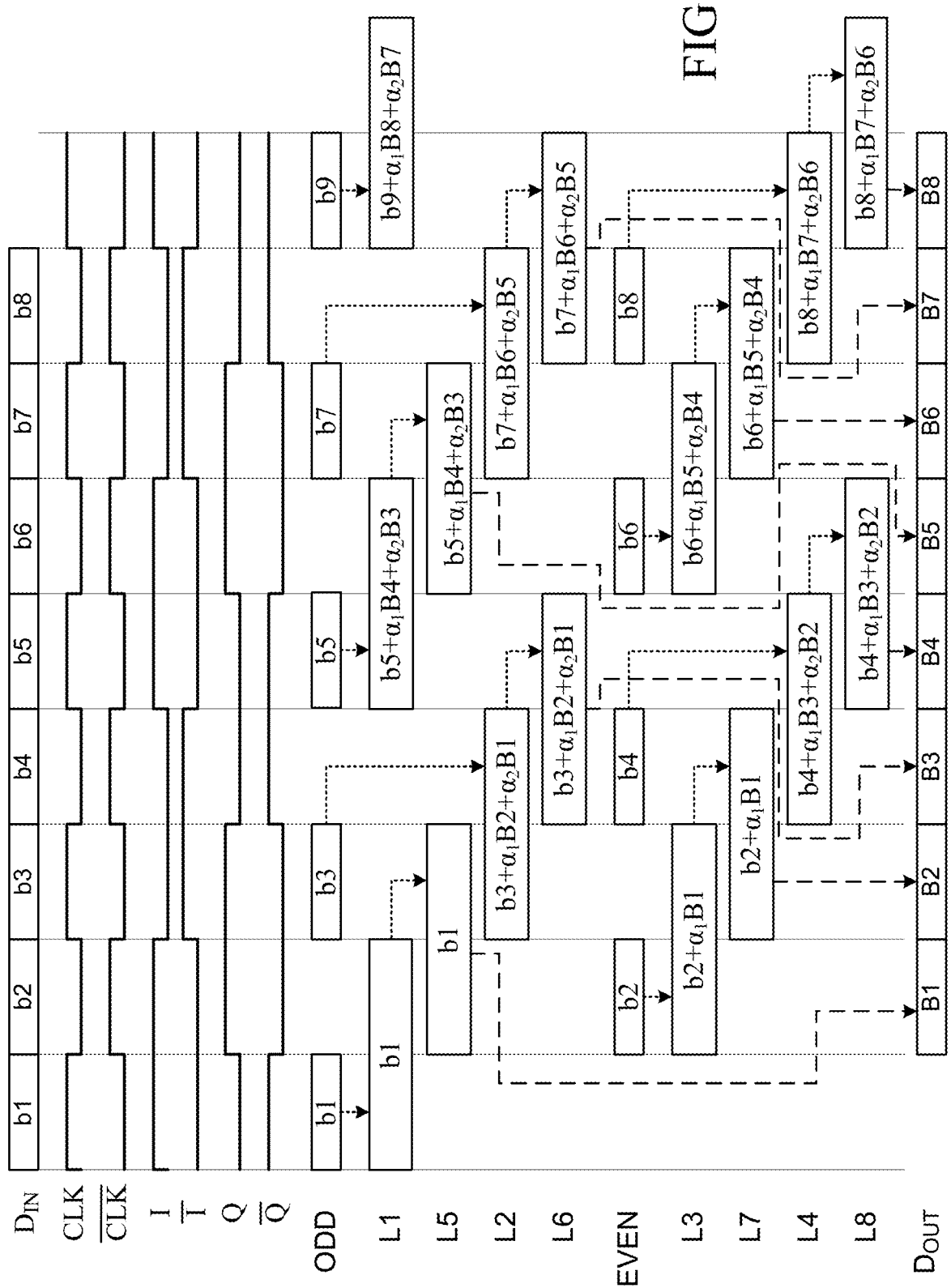

FIG. 5 is a schematic diagram of an example two-tap ½-rate charge-steering (CS) decision feedback equalizer (DFE) 200. FIG. 6 and FIG. 7 are example timing diagrams of an input data stream, an output data stream, various ½-rate and ¼-rate clocks, and the state of various elements in the DFE 200.

The DFE 200 comprises all of the same components as the DFE 100 as well as additional components. Components of the DFE 200 are driven by the same clocks that as in the DFE 100. The DFE 200 handles the same input data stream $D_{IN}$ as the DFE 100.

The DFE 200 comprises eight ¼-rate CS latches 111 through 118 (labeled "L1" through "L8", respectively). In this document, the latches L1 through L4 are referred to as "primary latches" and the latches L5 through L8 are referred to as "secondary latches".

The secondary latch L5 is driven by Q and samples the value held in the primary latch L1 when Q is high. The secondary latch L6 is driven by $\overline{Q}$ and samples the value held in the primary latch L2 when $\overline{Q}$ is high. The secondary latch L7 is driven by $\bar{I}$ and samples the value held in the primary latch L3 when $\bar{I}$ is high. The secondary latch L8 is driven by I, and samples the value held in the primary latch L4 when I is high.

In the DFE 200 the line connecting the output of the even input latch 102 to the input of the primary latch L3 and to the input of the primary latch L4 is affected not only by the primary taps 121 and 122 characterized by a real-valued coefficient $\alpha_1$ described above with respect to DFE 100 but also by secondary taps 127 and 128 characterized by a real-valued coefficient $\alpha_2$.

The secondary tap 127 is coupled to the output of the secondary latch L7, and the secondary tap 128 is coupled to the output of the secondary latch L8. When I is high, the secondary latch L7 is in its reset mode, and the secondary latch L8 holds a value. When $\bar{I}$ is high, the secondary latch L8 is in its reset mode, and the secondary latch L7 holds a value. Accordingly, when I is high, the secondary tap 128 provides a product of the coefficient $\alpha_2$ and the value held in the secondary latch L8, and when $\bar{I}$ is high, the secondary tap 127 provides a product of the coefficient $\alpha_2$ and the value held in the secondary latch L7.

In the DFE 200, the line connecting the output of the odd input latch 101 to the input of the primary latch L1 and to the input of the primary latch L2 is affected not only by the primary taps 123 and 124 characterized by the coefficient $\alpha_1$ but also by the secondary taps 125 and 126 characterized by the coefficient $\alpha_2$.

The secondary tap 125 is coupled to the output of the secondary latch L5, and the secondary tap 126 is coupled to the output of the secondary latch L6. When Q is high, the secondary latch L6 is in its reset mode, and the secondary latch L5 holds a value. When $\overline{Q}$ is high, the secondary latch L5 is in its reset mode, and the secondary latch L6 holds a value. Accordingly, when Q is high, the secondary tap 125 provides a product of the coefficient $\alpha_2$ and the value held in the secondary latch L5, and when $\overline{Q}$ is high, the secondary tap 126 provides a product of the coefficient $\alpha_2$ and the value held in the secondary latch L6.

When I is high, the primary tap 121 and the secondary tap 128 contribute to the input of the primary latch L3. When $\bar{I}$ is high, the primary tap 122 and the secondary tap 127 contribute to the input of the primary latch L4. When $\overline{Q}$ is high, the primary tap 123 and the secondary tap 125 contribute to the input of the primary latch L2. When Q is high, the primary tap 124 and the secondary tap 126 contribute to the input of the primary latch L1. The DFE 200 is denoted a two-tap CS DFE because at any given time, two taps contribute to the input of a primary latch.

The primary latch L1 is driven by I. When I is high and CLK is high, the value sampled by the primary latch L1 is the sum of the value held in the odd input latch 101, the value provided by the primary tap 124, and the value provided by the secondary tap 126. That is, L1=ODD+ $\alpha_1$L4+$\alpha_2$L6. When I is high and $\overline{CLK}$ is high, the value held in the primary latch L1 is captured by the secondary latch L5 and consequently becomes part of the output data stream $D_{OUT\text{-}1}$.

The primary latch L2 is driven by $\overline{I}$. When $\overline{I}$ is high and CLK is high, the value sampled by the primary latch L2 is the sum of the value held in the odd input latch 101, the value provided by the primary tap 123, and the value provided by the secondary tap 125. That is, L2=ODD+ $\alpha_1$L3+$\alpha_2$L5. When $\overline{I}$ is high and $\overline{CLK}$ is high, the value held in the primary latch L2 is captured by the secondary latch L6 and consequently becomes part of the output data stream $D_{OUT\text{-}2}$.

The primary latch L3 is driven by Q. When Q is high and CLK is high, the value sampled by the primary latch L2 is the sum of the value held in the even input latch 102, the value provided by the primary tap 121, and the value provided by the primary tap 128. That is, L3=EVEN+$\alpha_1$L1+ $\alpha_2$L8. When Q is high and $\overline{CLK}$ is high, the value held in the primary latch L3 is captured by the secondary latch L7 and consequently becomes part of the output data stream $D_{OUT\text{-}3}$.

The primary latch L4 is driven by $\overline{Q}$. When $\overline{Q}$ is high and CLK is high, the value sampled by the primary latch L4 is the sum of the value held in the even input latch 102, the value provided by the primary tap 122, and the value provided by the secondary tap 127. That is, L4=EVEN+ $\alpha_1$L2+$\alpha_2$L7. When $\overline{Q}$ is high and $\overline{CLK}$ is high, the value held in the primary latch L4 is captured by the secondary latch L8 and consequently becomes part of the output data stream $D_{OUT\text{-}4}$.

If the input data stream $D_{IN}$ represents bit values denoted $\{b_1, b_2, b_3, \ldots\}$, the output data stream $D_{OUT}$ comprised of the output data streams $D_{OUT\text{-}1}$, $D_{OUT\text{-}2}$, $D_{OUT\text{-}3}$, and $D_{OUT\text{-}4}$ represents bit values denoted $\{B_1, B_2, B_3, \ldots\}$. The relationship between the input bit values and output bit values is summarized in Table 2:

TABLE 2

| Input Bit Value | Output Bit Value |
| --- | --- |
| $b_1$ | $B_1 = b_1$ |
| $b_2$ | $B_2 = b_2 + \alpha_1 B_1$ |
| $b_3$ | $B_3 = b_3 + \alpha_1 B_2 + \alpha_2 B_1$ |
| $b_4$ | $B_4 = b_4 + \alpha_1 B_3 + \alpha_2 B_2$ |
| $b_5$ | $B_5 = b_5 + \alpha_1 B_4 + \alpha_2 B_3$ |
| $b_6$ | $B_6 = b_6 + \alpha_1 B_5 + \alpha_2 B_4$ |
| $b_7$ | $B_7 = b_7 + \alpha_1 B_6 + \alpha_2 B_5$ |
| $b_8$ | $B_8 = b_8 + \alpha_1 B_7 + \alpha_2 B_6$ |
| ... | ... |

The DFE 200 is denoted a two-tap CS DFE because each output bit value $B_{k+2}$ is the input value $b_{k+2}$ adjusted by the nearest previous output bit value $B_{k+1}$ and by the next-nearest previous output bit value $B_k$. The coefficient $\alpha_1$ applied by the primary taps 121, 122 and by the primary taps 123, 124 expresses the strength of the adjustment that the nearest previous adjusted bit value has on the bit value currently being adjusted. The coefficient $\alpha_2$ applied by the secondary taps 127, 128 and by the secondary taps 125, 126 expresses the strength of the adjustment that the next-nearest previous adjusted bit value has on the bit value currently being adjusted. It is expected that the coefficients $\alpha_1$ and $\alpha_2$ are constant or slowly varying (relative to the data rate).

The DFE 200 may be considered to have two branches: an "odd" branch 21 and an "even" branch 22. The odd branch 21 comprises the odd input latch 101, two pairs of latches (namely the primary latches L1, L2 and the secondary latches L5, L6), and two pairs of taps (namely the primary taps 123, 124 and the secondary taps 125, 126). The even branch 22 comprises the even input latch 102, two pairs of latches (namely the primary latches L3, L4 and the secondary latches L7, L8), and two pairs of taps (namely the primary taps 121, 122 and the secondary taps 127, 128).

Figure 8:
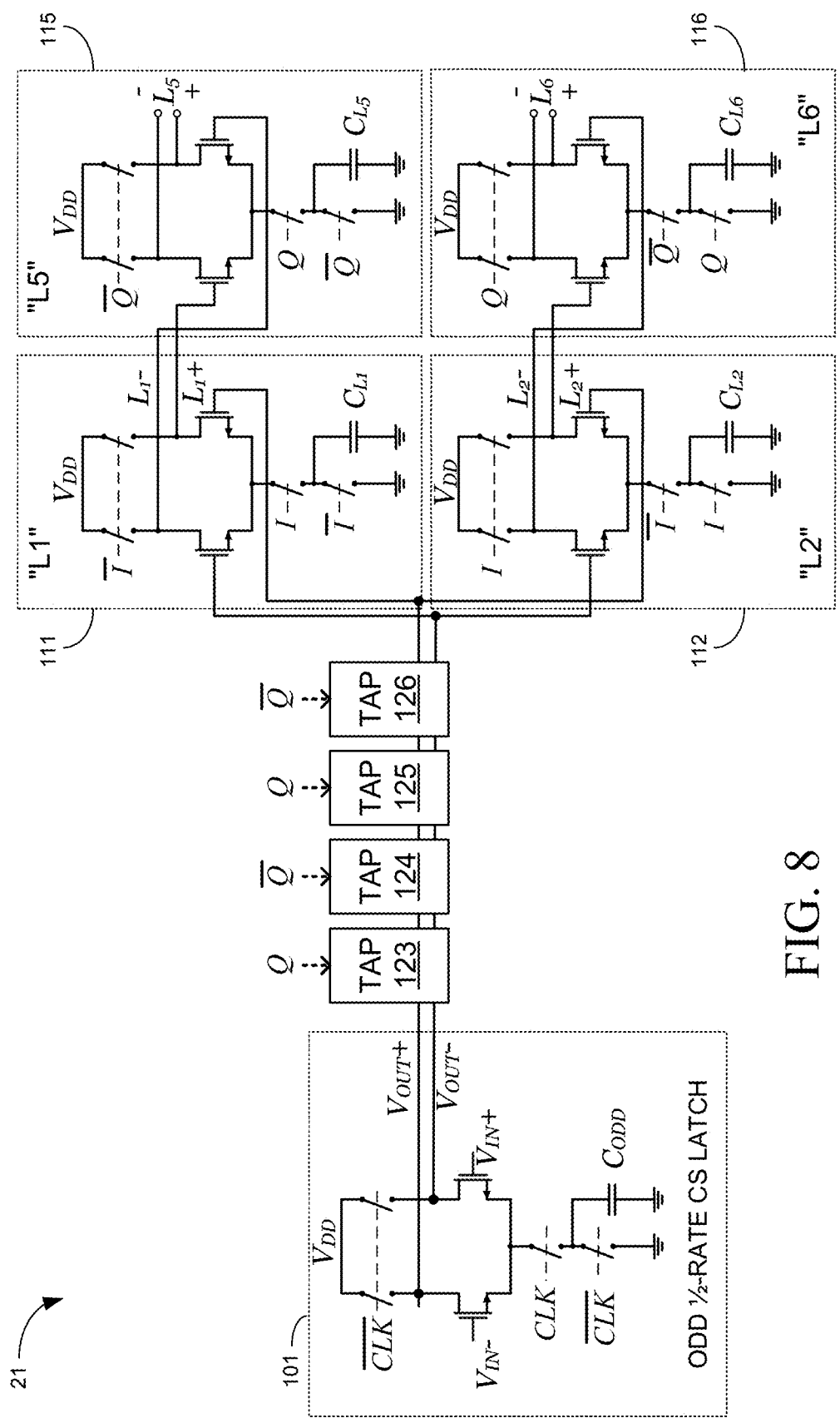
FIG. 8 is a partial circuit diagram of the "odd" branch of the example two-tap ½-rate CS DFE of FIG. 5.

FIG. 8 is a partial circuit diagram of the odd branch 21 of the DFE 200. FIG. 8 illustrates example circuitry of the odd input latch 101, of the primary latches L1 and L2, and of the secondary latches L5, and L6.

The example circuitry of the odd input latch 101 is as described above with respect to FIG. 4. The example circuitry of the primary latches L1 and L2 is as described above with respect to FIG. 4, except that the gate nodes of the n-channel output transistors are connected to the differential pair of output nodes of the odd input latch 101 as adjusted by the taps 123, 124, 125, 126.

The secondary latch L5 comprises a differential pair of n-channel output transistors, a pair of switches driven by $\overline{Q}$, an evaluation switch driven by Q, a reset switch driven by $\overline{Q}$, and a capacitor having capacitance $C_{L5}$. The pair of switches are connected between drain nodes of the n-channel output transistors and the first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential pair of output nodes of the primary latch L1 ($L_1+$ and $L_1-$). The drain nodes of the n-channel output transistors are connected to a differential pair of output nodes (labeled "$L_5+$" and "$L_5-$") of the secondary latch L5.

The secondary latch L6 comprises a differential pair of n-channel output transistors, a pair of switches driven by Q, an evaluation switch driven by $\overline{Q}$, a reset switch driven by Q, and a capacitor having capacitance $C_{L6}$. The pair of switches are connected between drain nodes of the n-channel output transistors and the first power supply rail (in this example, supplying a voltage $V_{DD}$). The reset switch is connected between the evaluation switch and the second power supply rail (in this example, ground). The capacitor is connected between the second power supply rail and a node between the reset switch and the evaluation switch. The evaluation switch is connected to the source nodes of the n-channel output transistors. The gate nodes of the n-channel output transistors are connected to the differential pair of output nodes of the primary latch L2 ($L_2+$ and $L_2-$). The drain nodes of the n-channel output transistors are connected to a differential pair of output nodes (labeled "$L_6+$" and "$L_5-$") of the secondary latch L6.

The even branch 22 of the DFE 200 has similar circuitry to the odd branch 21 of the DFE 200, differing in which clocks drive which switches.

Figure 9:
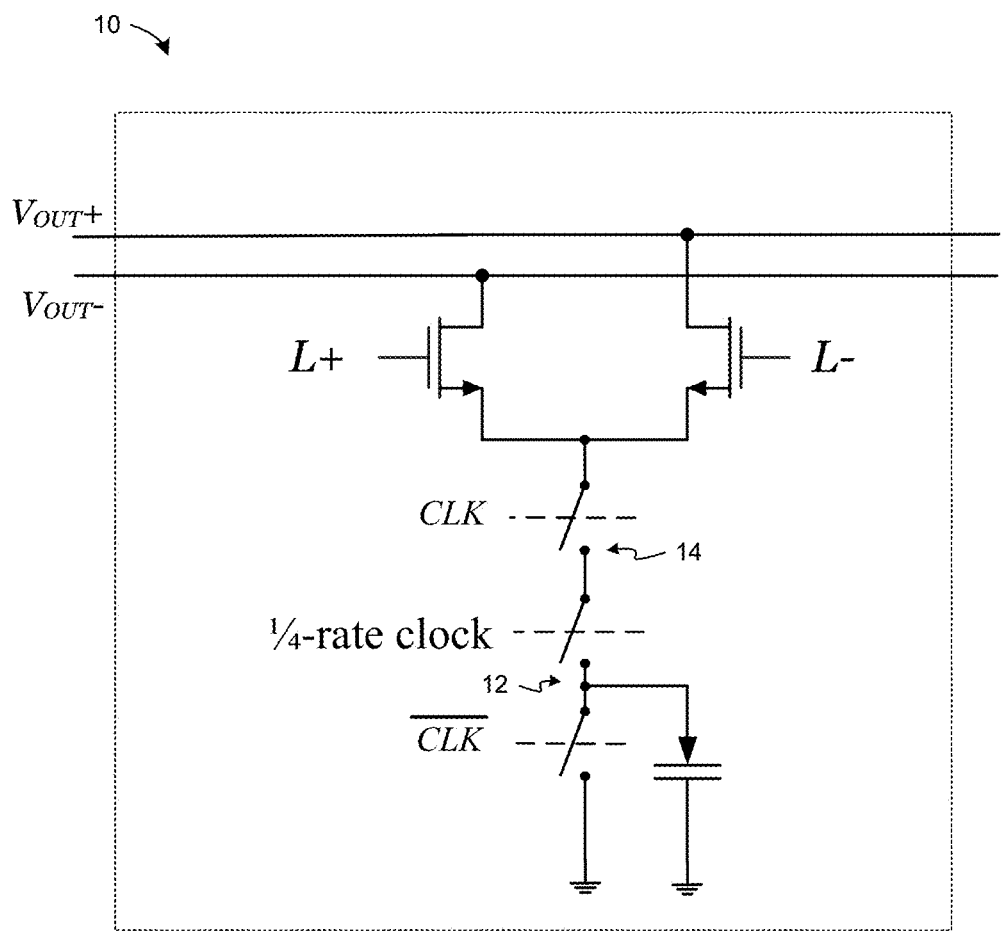
FIG. 9 is a circuit diagram of a prior art tap.

FIG. 9 is a circuit diagram of a prior art tap 10, described in A. Manian and B. Razavi, "A 40-Gb/s 14-mW CMOS Wireline Receiver", *IEEE Journal of Solid-State Circuits*, vol. 52, no. 9, September 2017.

The circuitry of prior art tap 10 comprises a differential pair of n-channel output transistors and a switching circuit that connects the drain nodes of the n-channel output transistors to the second power supply rail (in this example, ground). The gate nodes of the n-channel output transistors are connected to a differential pair of output nodes (labeled "L+" and "L−") of a latch to receive a differential representation of the bit value held by that latch. The source nodes of the n-channel output transistors are connected to the differential pair of output nodes (labeled "$V_{OUT}+$" and "$V_{OUT}-$") of an input latch.

The switching circuit comprises a variable capacitor and a stacked series of switches: a "bottom" switch connecting the second power supply rail to a first intermediate node 12, a "middle" switch driven by a ¼-rate clock connecting the "bottom" switch to a second intermediate node 14, and a "top" switch connecting the second intermediate node 14 to the source nodes of the n-channel output transistors. The variable capacitor connects the second power supply rail to the first intermediate node 12. As illustrated in FIG. 9, the "top" switch is driven by CLK and the "bottom" switch is driven by its complementary clock, namely $\overline{CLK}$. In an alternate implementation, the "bottom" switch is driven by CLK and the "top" switch is driven by its complementary clock, namely $\overline{CLK}$.

Two elements of the prior art tap 10 are driven by ½-rate clocks. As data rates increase, the routing of ½-rate clocks is difficult. Stacked series switches, such as used in the prior art tap 10, are difficult to implement in Fin Field-Effect-Transistor (FinFET) technologies. The use of numerous switches in the prior art tap 10 requires significant power in the clock buffers.

Figure 10:
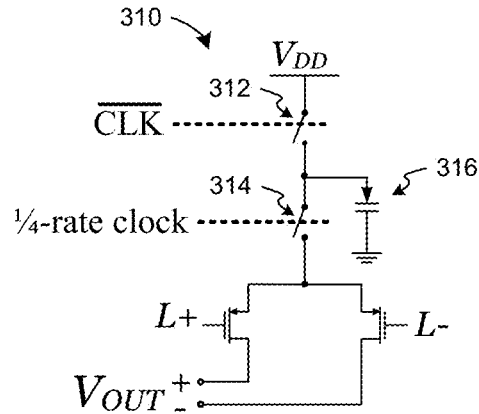
FIGS. 10, 11, 12, 13, 14, and 15 are circuit diagrams of new taps.

FIG. 10 is a circuit diagram of an example CS tap 310, which may be used as any one of the taps 121 through 128, or in a ½-rate CS DFE having more than two taps. The tap 310 is suitable for implementation using finFET technologies.

The circuitry of the tap 310 comprises a differential pair of p-channel input transistors and a switching circuit that connects the source nodes of the p-channel input transistors to the first power supply rail (in this example, supplying the voltage $V_{DD}$). The gate nodes of the p-channel input transistors are connected to a differential pair of output nodes (labeled "L+" and "L−") of a ¼-rate CS latch that is one of the primary latches or one of the secondary latches, to receive a differential representation of the bit value held by that ¼-rate CS latch. The drain nodes of the p-channel input transistors are connected to the differential pair of output nodes (labeled "$V_{OUT}+$" and "$V_{OUT}-$") of either the odd input latch or the even input latch.

The switching circuit comprises a reset switch 312 connecting the first power supply rail to an intermediate node, an evaluation switch 314 connecting the intermediate node to the source nodes of the p-channel input transistors, and a variable capacitor 316 connected between the intermediate node and the second power supply rail (in this example, ground). The reset switch 312 is driven by the ½-rate clock labeled $\overline{CLK}$, and the evaluation switch 314 is driven by one of the ¼-rate clocks described in this document.

The variable capacitor 316 helps pull one of the differential output nodes of the input latch towards the first power supply rail instead of helping to pull the other one of the differential output nodes of the input latch towards the second power supply rail. The capacitance of the variable capacitor 316 is related to the coefficient α that characterizes the tap 310. For example, where the tap 310 is implementing any one of the primary taps, the coefficient is $\alpha_1$. In another example, where the tap 310 is implementing any one of the secondary taps, the coefficient is $\alpha_2$.

Figure 11:
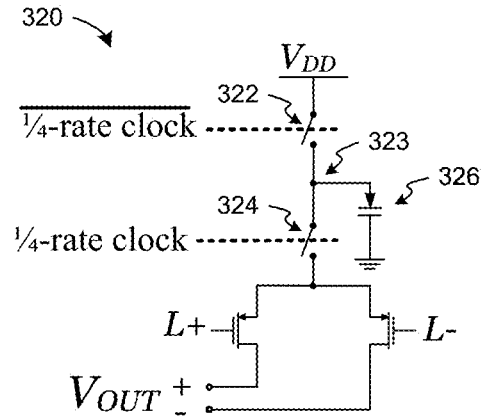

FIG. 11 is a circuit diagram another example CS tap 320, which may be used as any one of the taps 121 through 128, or in a ½-rate CS DFE having more than two taps. The tap 320 is suitable for implementation using finFET technologies.

The circuitry of the tap 320 comprises a differential pair of p-channel input transistors and a switching circuit that connects the source nodes of the p-channel input transistors to the first power supply rail (in this example, supplying the voltage $V_{DD}$). The gate nodes of the p-channel input transistors are connected to a differential pair of output nodes (labeled "L+" and "L−") of a ¼-rate CS latch that is one of the primary latches or one of the secondary latches, to receive a differential representation of the bit value held by that ¼-rate CS latch. The drain nodes of the p-channel input transistors are connected to the differential pair of output nodes (labeled "$V_{OUT}+$" and "$V_{OUT}-$") of either the odd input latch or the even input latch.

The switching circuit comprises a reset switch 322 connecting the first power supply rail to an intermediate node 323, an evaluation switch 324 connecting the intermediate node 323 to the source nodes of the p-channel input transistors, and a variable capacitor 326 connected between the intermediate node and the second power supply rail (in this example, ground). The evaluation switch 324 is driven by one of the ¼-rate clocks described in this document, and the reset switch 322 is driven by the complement of the ¼-rate clock that drives the evaluation switch 324.

The variable capacitor 326 helps pull one of the differential output nodes of the input latch towards the first power supply rail instead of helping to pull the other one of the differential output nodes of the input latch towards the second power supply rail. The capacitance of the variable capacitor 326 is related to the coefficient α that characterizes the tap 320. For example, where the tap 320 is implementing any one of the primary taps, the coefficient is $\alpha_1$. In another example, where the tap 320 is implementing any one of the secondary taps, the coefficient is $\alpha_2$.

Figure 12:
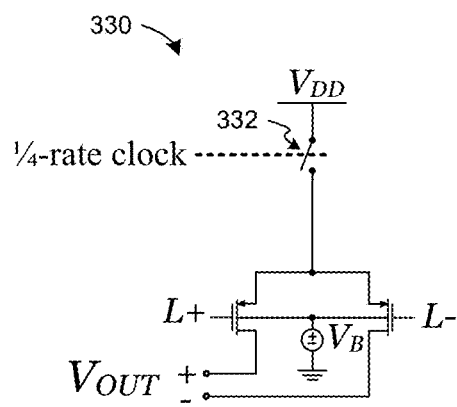

FIG. 12 is a circuit diagram of another example CS tap 330, which may be used as any one of the taps 121 through 128, or in a ½-rate CS DFE having more than two taps.

The circuitry of the tap 330 comprises a differential pair of p-channel input transistors and a switching circuit that connects the source nodes of the p-channel input transistors are connected to the first power supply rail (in this example, supplying the voltage $V_{DD}$), where the gate nodes of the p-channel input transistors are connected to a bulk bias voltage $V_B$. The gate nodes of the p-channel input transistors are connected to a differential pair of output nodes (labeled "L+" and "L−") of a ¼-rate CS latch that is one of the primary latches or one of the secondary latches, to receive a differential representation of the bit value held by that ¼-rate CS latch. The drain nodes of the p-channel input transistors are connected to the differential pair of output nodes (labeled "$V_{OUT}+$" and "$V_{OUT}-$") of either the odd input latch or the even input latch.

The switching circuit comprises a single reset switch 332 driven by one of the ¼-rate clocks described in this document.

The bulk bias voltage $V_B$ is used to change the threshold voltage of the differential pair of p-channel input transistors and in turn change the period of time for which the first power supply is adjusting the output of the input latch. The setting of the bulk bias voltage $V_B$ is related to the coefficient α that characterizes the tap 330. The tap 330 is not suitable for implementation using finFET technologies, because the bulk bias cannot be adjusted in those technologies. Furthermore, the tap 330 cannot be completely shut off. Stated differently, even if the bulk bias voltage is forced to zero, the p-channel input transistors will still have a certain threshold voltage that causes them to turn on, and for channels with a good impulse response (that is, little energy spreading between bits), the tap 330 may still add intersymbol interference. However, the tap 330 is suitable for implementation in bulk CMOS and FD-SOI CMOS.

Figure 13:
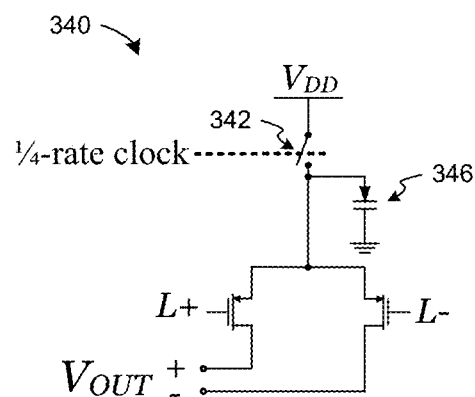

FIG. 13 is a circuit diagram of another example CS tap 340, which may be used as any one of the taps 121 through 128, or in a ½-rate CS DFE having more than two taps.

The circuitry of the tap 340 comprises a differential pair of p-channel input transistors and a switching circuit that connects the source nodes of the p-channel input transistors to the first power supply rail (in this example, supplying the voltage $V_{DD}$). The gate nodes of the p-channel input transistors are connected to a differential pair of output nodes (labeled "L+" and "L−") of a ¼-rate CS latch that is one of the primary latches or one of the secondary latches, to receive a differential representation of the bit value held by that ¼-rate CS latch. The drain nodes of the p-channel input transistors are connected to the differential pair of output nodes (labeled "$V_{OUT}$+" and "$V_{OUT}$−") of either the odd input latch or the even input latch.

The switching circuit comprises a single reset switch 342 that connects the source nodes of the p-channel input transistors to the first power supply rail, and a variable capacitor 346 connected between the source nodes of the p-channel input transistors and the second power supply rail (in this example, ground). The single reset switch 342 is driven by one of the ¼-rate clocks described in this document. The variable capacitor 346 helps pull one of the differential output nodes of the input latch towards the first power supply rail instead of helping to pull the other one of the differential output nodes of the input latch towards the second power supply rail. The capacitance of the variable capacitor 346 is related to the coefficient α that characterizes the tap 340. For example, where the tap 340 is implementing any one of the primary taps, the coefficient is $\alpha_1$. In another example, where the tap 340 is implementing any one of the secondary taps, the coefficient is $\alpha_2$. The tap 340 is suitable for implementation using finFET technologies, however, the tap 340 cannot be completely shut off.

It was shown in U.S. Patent Publication 2018/0302070 that a small varactor at the drain of a differential pair of transistors can be used to change the transconductance, denoted $g_m$, of the transistors, resulting in the same effect as the bulk bias of the tap 330.

Figure 14:
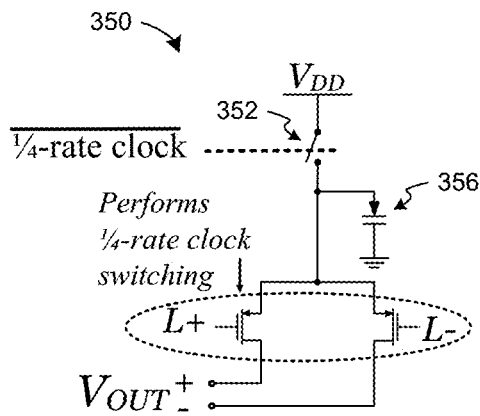

FIG. 14 is a circuit diagram another example CS tap 350, which may be used as any one of the taps 121 through 128, or in a ½-rate CS DFE having more than two taps. The tap 350 is suitable for implementation using finFET technologies.

The circuitry of the tap 350 comprises a differential pair of p-channel input transistors and a switching circuit that connects the source nodes of the p-channel input transistors to the first power supply rail (in this example, supplying the voltage $V_{DD}$). The gate nodes of the p-channel input transistors are connected to a differential pair of output nodes (labeled "L+" and "L−") of a ¼-rate CS latch that is one of the primary latches or one of the secondary latches, to receive a differential representation of the bit value held by that ¼-rate CS latch. The drain nodes of the p-channel input transistors are connected to the differential pair of output nodes (labeled "$V_{OUT}$+" and "$V_{OUT}$−") of either the odd input latch or the even input latch.

The switching circuit comprises a single reset switch 352 that connects the source nodes of the p-channel input transistors to the first power supply rail, and a variable capacitor 356 connected between the source nodes of the p-channel input transistors and the second power supply rail (in this example, ground). The single reset switch 352 is driven by one of the ¼-rate clocks described in this document. The variable capacitor 356 helps pull one of the differential output nodes of the input latch towards the first power supply rail instead of helping to pull the other one of the differential output nodes of the input latch towards the second power supply rail. The capacitance of the variable capacitor 356 is related to the coefficient α that characterizes the tap 350. For example, where the tap 350 is implementing any one of the primary taps, the coefficient is $\alpha_1$. In another example, where the tap 350 is implementing any one of the secondary taps, the coefficient is $\alpha_2$.

CS latches have a return-to-zero output as both output nodes reach $V_{DD}$ during the reset period. In view of this and the use of p-channel input transistors in the differential pair, the differential pair in the tap 350 acts as a ¼-rate switch 180° out of phase with the single reset switch. When the ¼-rate CS latch connected to the gate nodes of the p-channel input transistors is in its evaluation mode, the capacitor of the tap 350 has a discharge path to the differential pair of output nodes (labeled "$V_{OUT}$+" and "$V_{OUT}$−") of the input latch. Conversely, when the ¼-rate CS latch connected to the gate nodes of the p-channel input transistors is in its reset mode, the differential pair of p-channel input transistors "opens" and the reset switch closes, charging the capacitor back to $V_{DD}$.

In the taps 310, 320, 330, 340, and 350, at least one switch is driven by one of the ¼-rate clocks described in this document. The determination whether the switch is driven by the in-phase clock I or its complementary clock $\bar{I}$ or the quadrature clock Q or its complementary clock $\bar{Q}$ depends on which tap of the ½-rate CS DFE is being implemented. For example, if the primary tap 121 is being implemented as the tap 340, then the switch 342 is driven by the ¼-rate in-phase clock I. In another example, if the secondary tap 125 is being implemented as the tap 330, then the switch 332 is driven by the ¼-rate quadrature clock Q.

Figure 15:
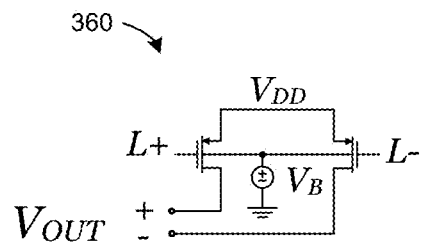

FIG. 15 is a circuit diagram of another example CS tap 360, which may be used as any one of the taps 121 through 128, or in a ½-rate CS DFE having more than two taps.

The circuitry of the tap 360 comprises a differential pair of p-channel input transistors. The source nodes of the p-channel input transistors are directly connected to the first power supply rail (in this example, supplying the voltage $V_{DD}$). The gate nodes of the p-channel input transistors are connected to a differential pair of output nodes (labeled "L+" and "L−") of a ¼-rate CS latch that is one of the primary latches or one of the secondary latches, to receive a differential representation of the bit value held by that ¼-rate CS latch. The drain nodes of the p-channel input transistors are connected to the differential pair of output nodes (labeled "$V_{OUT}$+" and "$V_{OUT}$−") of either the odd input latch or the even input latch. The gate nodes of the p-channel input transistors are connected to a bulk bias voltage $V_B$.

The bulk bias voltage $V_B$ is used to change the threshold voltage of the differential pair of p-channel input transistors and in turn change the period of time for which the first power supply is adjusting the output of the input latch. The setting of the bulk bias voltage $V_B$ is related to the coefficient α that characterizes the tap 360. The tap 360 is not suitable for implementation using finFET technologies, because the bulk bias cannot be adjusted in those technologies. Furthermore, the tap 360 cannot be completely shut off. However, the tap 360 is suitable for implementation in bulk CMOS and FD-SOI CMOS.

An element driven by a ½-rate clock is denoted a "½-rate element". Because the taps 320, 330, 340, 350, and 360 do not comprise any ½-rate elements, there is no need to route a ½-rate clock (for example, CLK or $\overline{\text{CLK}}$) to those taps. Furthermore, the absence of any ½-rate elements in the taps 320, 330, 340, 350, and 360 means that clock buffer power for any switches that are driven by a ¼-rate clock has been halved. When a reset switch is driven by a ¼-rate clock (as is the case for the taps 320, 330, 340, and 350), this extends how long the tap capacitor will charge for, but it is desirable in this example for this capacitor to reach $V_{DD}$ regardless, so no extra power is consumed. In fact, a larger resistance can be tolerated and the capacitor will still reach $V_{DD}$, given the doubled reset period. This permits making the reset switch smaller, saving more clock buffer power. Anytime a ¼-rate switch is used in place of a ½-rate switch, the period during which the switch is on has doubled and so the resistance that makes up the switch's time constant can double. To further clarify, the time it takes to charge a capacitor to 99% is given by 5RC, where R is the resistance between the power supply and the capacitor having capacitance C. Therefore, if the time is doubled and the capacitance has remained the same, the resistance can be doubled which allows the transistor to be halved in size. This in turns halves the transistors gate capacitance which saves clock buffer power.

Figure 16:
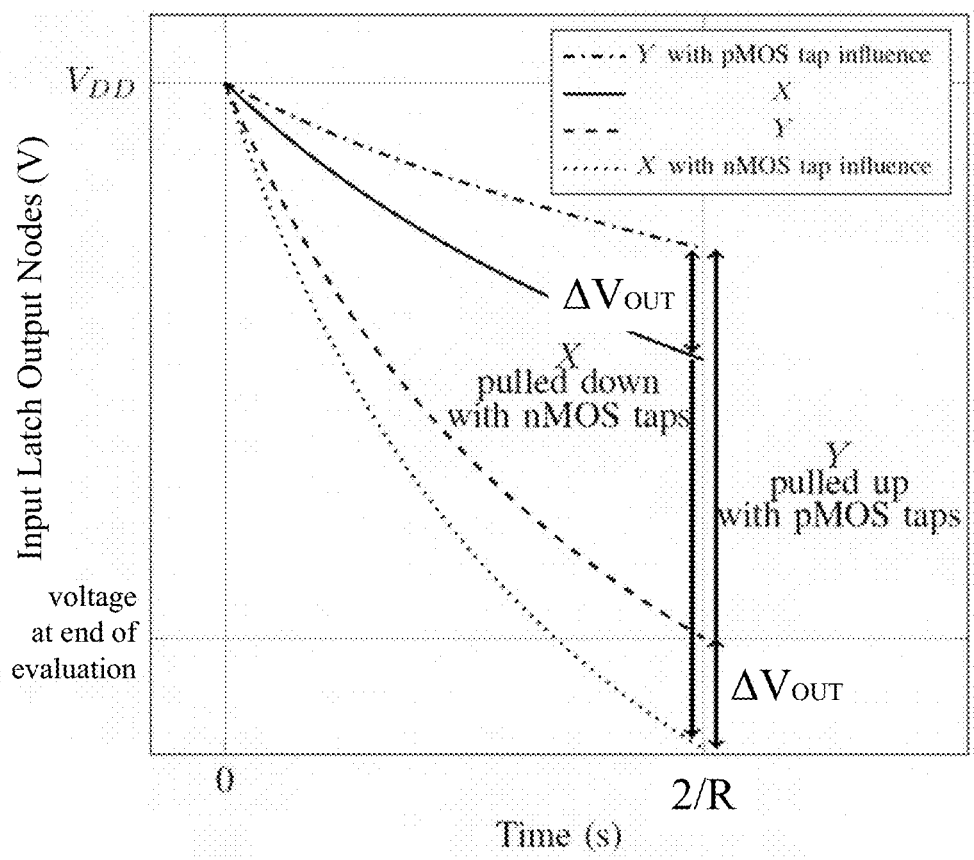
FIG. 16 illustrates a concept relating to the use of a tap having a differential pair of p-channel input transistors.

FIG. 16 illustrates a concept relating to the use of a tap having a differential pair of p-channel input transistors. X represents one of the output nodes of the input latch (for example, $V_{OUT}+$) and Y represents the other output node of the input latch (for example $V_{OUT}-$). $\Delta V_{OUT}$ is the differential swing between output nodes of the input latch (this can be expressed mathematically as $\Delta V_{OUT}=|(V_{OUT}+)-(V_{OUT}-)|$). Presume a wrong decision has been made at the output of the input latch, and the X node must go below Y. Traditionally, the X node would be pulled down (that is, towards the second power supply rail, which in this example is ground) to make the correct decision, but with the new taps, Y has been pulled up (that is, towards the first power supply rail, which in this example is $V_{DD}$). The final differential swing $\Delta V_{OUT}$ is the same regardless of which tap is used, but the amount that the capacitors in the input latch must be charged has been reduced with the use of p-channel input transistors in the tap.

Figure 17:
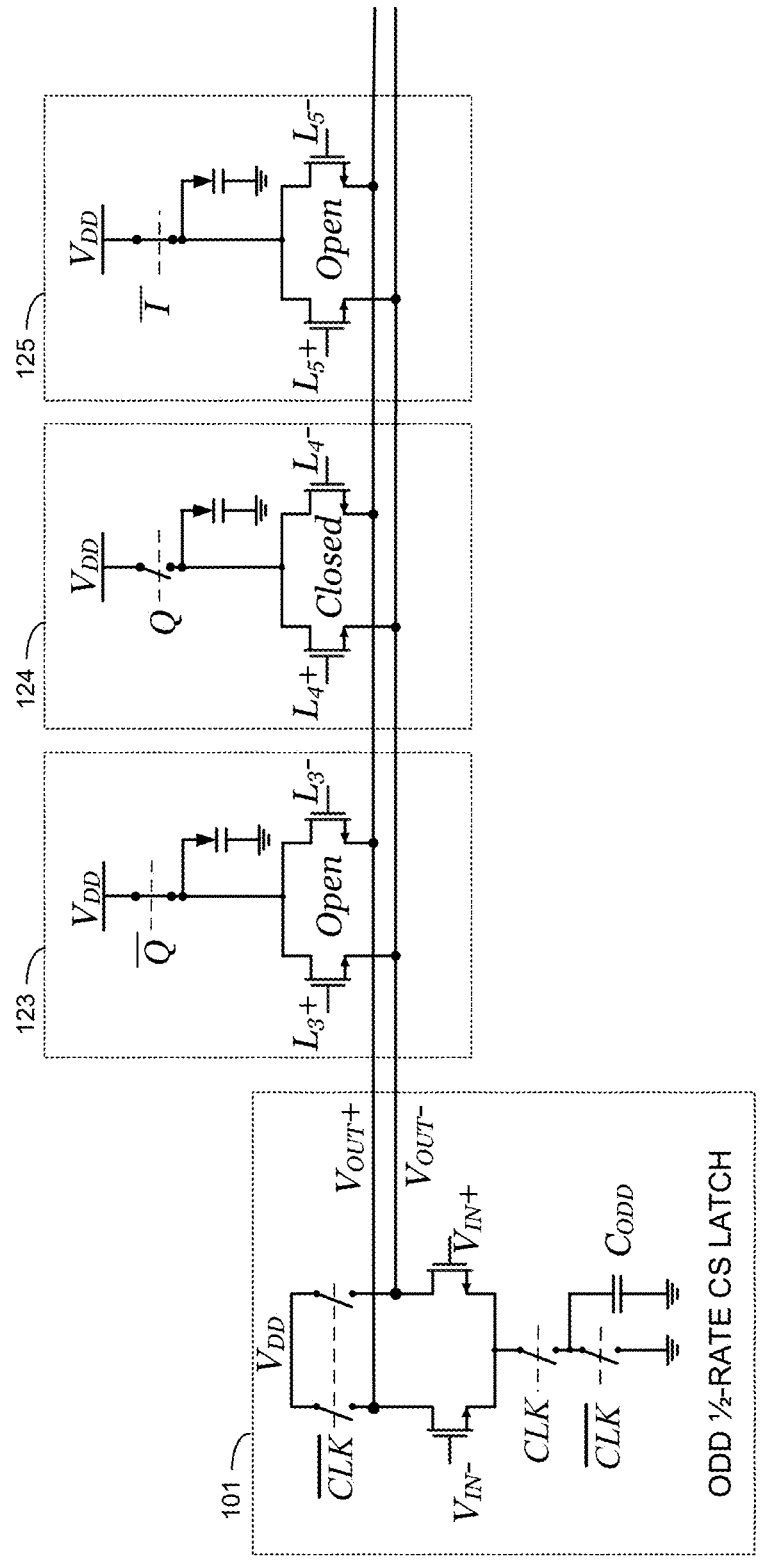
FIG. 17 and FIG. 18 jointly illustrate a circuit diagram of the "odd" branch of the example two-tap ½-rate CS DFE of FIG. 5 using the tap illustrated in FIG. 14 in a first state.
Figure 18:
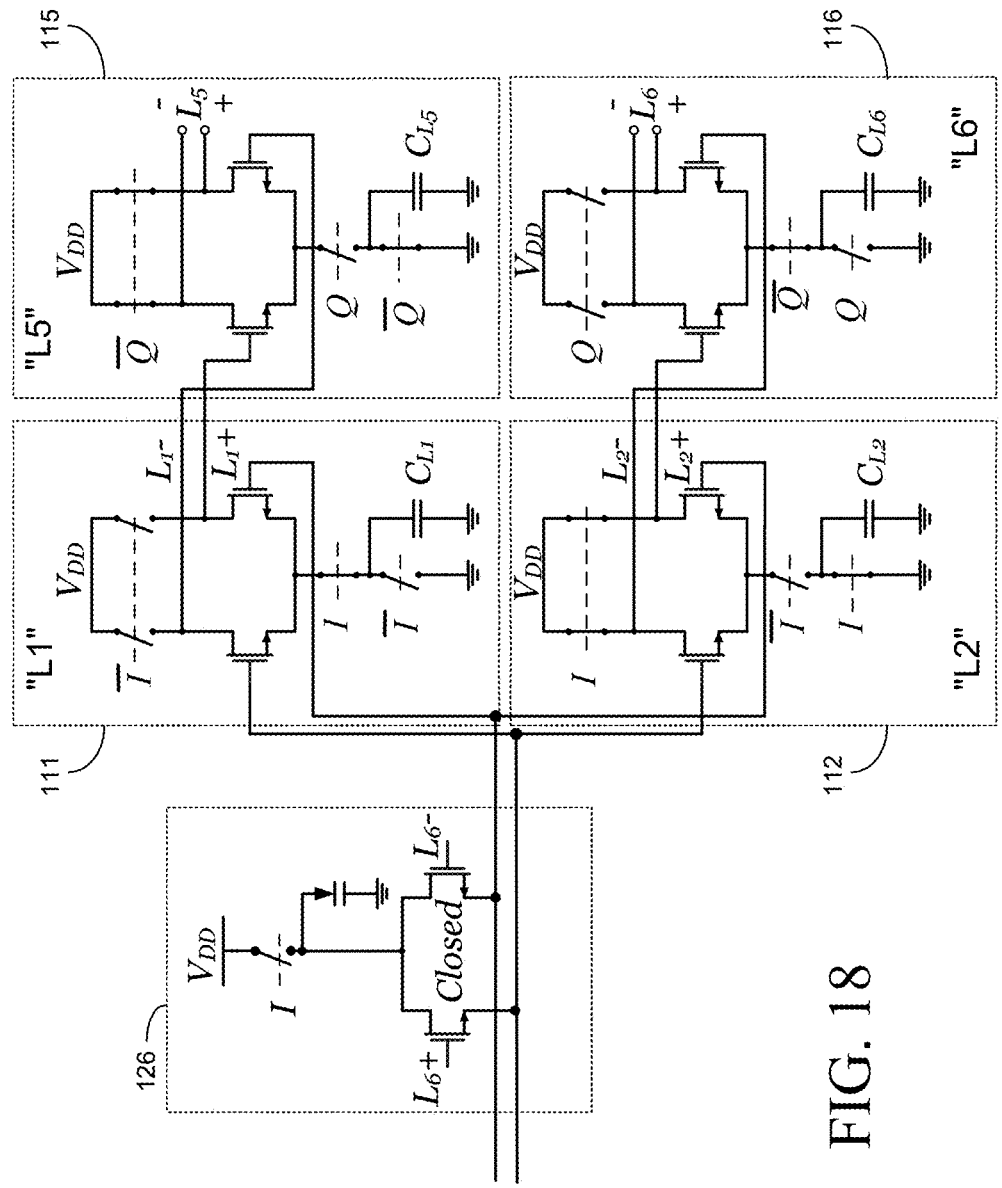

FIG. 17 and FIG. 18 jointly illustrate a circuit diagram of the "odd" branch of the DFE 200 in a first state, the DFE 200 using the tap 350 for the taps 123, 124, 125 and 126. In this first state, the primary latch L4 and the secondary latch L6 are in evaluation mode, and the primary latch L3 and the secondary latch L5 are in reset mode.

Figure 19:
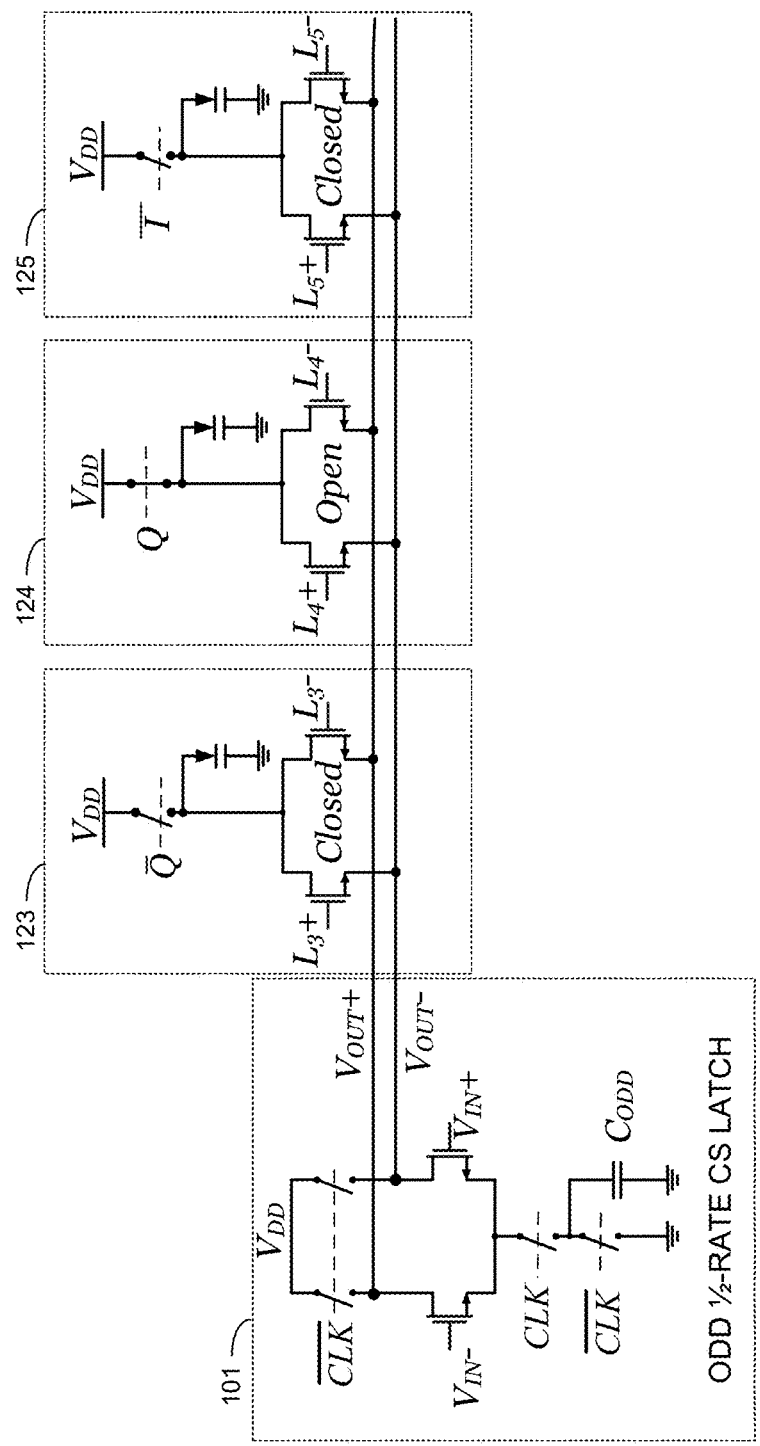
FIG. 19 and FIG. 20 jointly illustrate a circuit diagram of the "odd" branch of the example two-tap ½-rate CS DFE of FIG. 5 using the tap illustrated in FIG. 14 in a second state.
Figure 20:
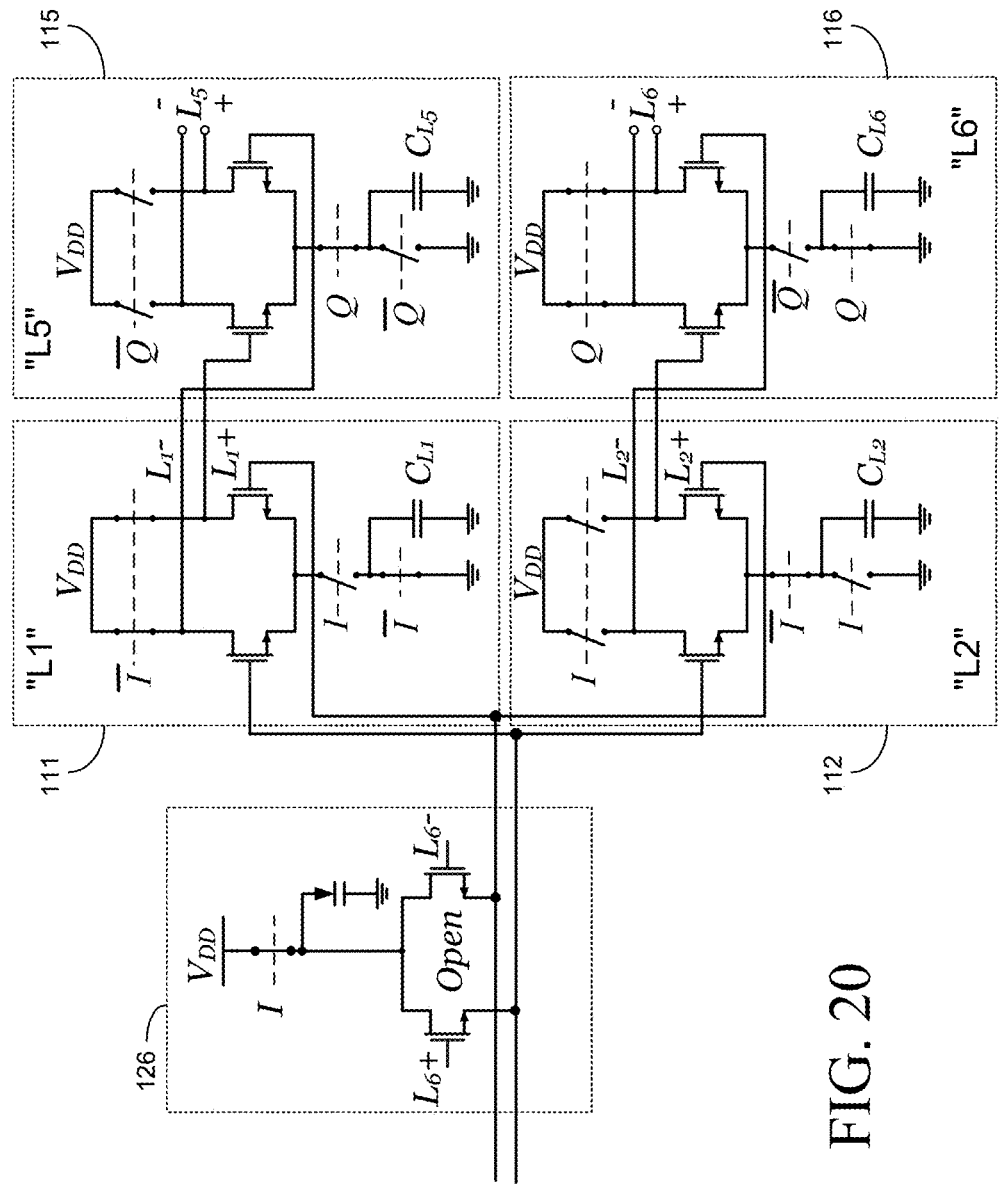

FIG. 19 and FIG. 20 jointly illustrate a circuit diagram of the "odd" branch of the DFE 200 in a second state, the DFE 200 using the tap 350 for the taps 123, 124, 125 and 126. In this second state, the primary latch L3 and the secondary latch L5 are in evaluation mode, and the primary latch L4 and the secondary latch L6 are in reset mode.

Figure 21:
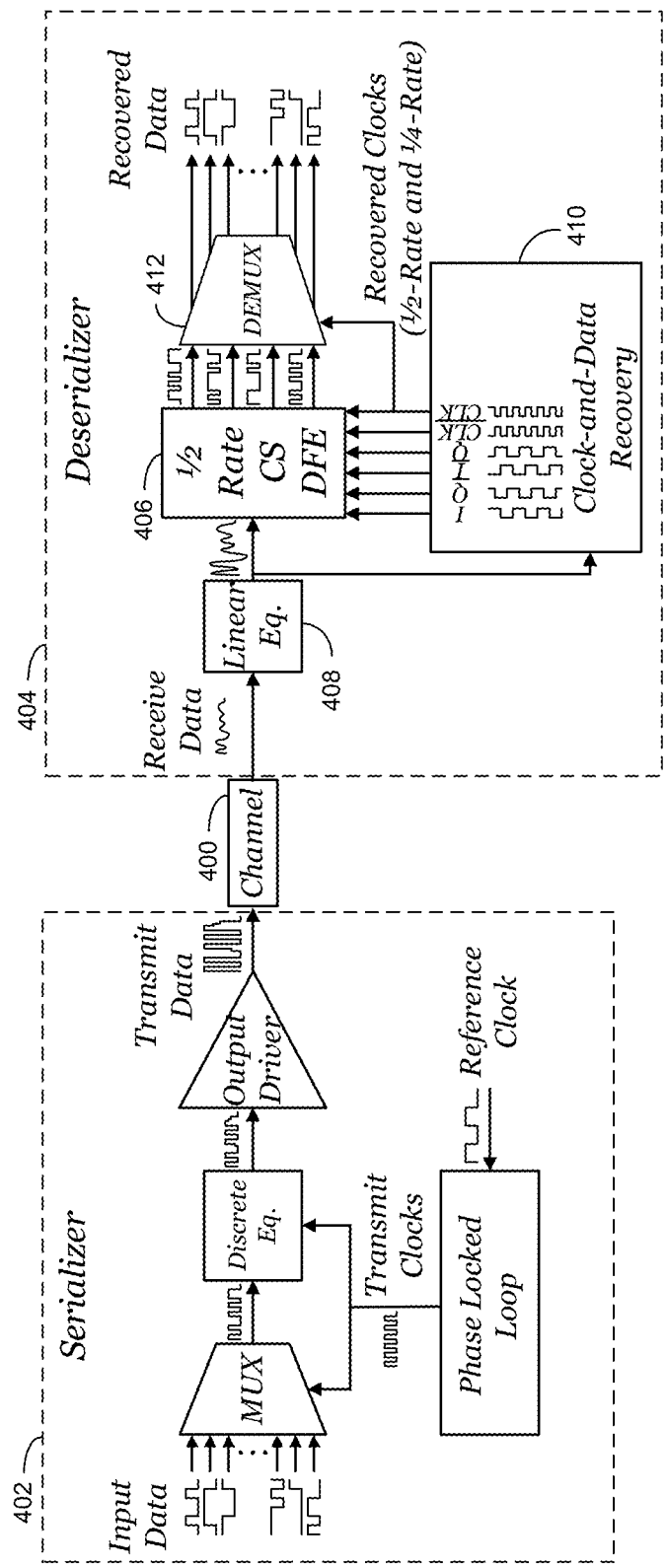
FIG. 21 is block diagram showing transfer of data over a channel from an example serializer device to an example deserializer device, where the deserializer device comprises a ½-rate CS DFE that incorporates any one of the new taps illustrated in FIGS. 10, 11, 12, 13, 14, and 15.

FIG. 21 is block diagram showing transfer of data over a channel 400 from an example serializer device 402 to an example deserializer device 404, where the deserializer device 404 comprises a ½-rate CS DFE 406 that incorporates any one or more of the new taps illustrated in FIGS. 10, 11, 12, 13, 14, and 15. The DFE 100 and the DFE 200 are two examples of ½-rate CS DFEs that could be used for the ½-rate CS DFE 406. The DFE 406 further comprises a linear equalizer module 408 to amplify the signal received over the channel 400, a clock-and-data recovery module 410, and a demultiplexer module 412 to deserialize the output of the DFE 406. The DFE 406 and the clock-and-data recovery module 410 act on the amplified signal output from the linear equalizer module 408. The clock-and-data recovery module 410 provides the various ½-rate and ¼-rate clocks to the DFE 406 and to the demultiplexer module 412.

Simulations of transfer of data over a channel from a serializer device to a deserializer device were performed, with the deserializer device including a Continuous Time Linear Equalizer (CTLE), a Low Frequency Equalizer (LFE), and a two-tap ½-rate CS DFE. CTLEs provide an amplitude boost to incoming data. LFEs provide linear gain, though at lower frequencies, while the CTLE is designed to peak around the Nyquist frequency. The simulation results are presented with data randomly generated at 56 Gb/s and passed through a touchstone channel model from the IEEE 802.3 400 GbE task force. A channel loss of 14.47 dB can be seen at 28 GHz. Clocks used in the DFE are square with 10% rise and fall times and an amplitude of 1 Volt (V). $V_{DD}$ was also set to 1 V. The common-mode voltage is 800 mV. The program used for simulations was the Cadence® Virtuoso® custom design platform using the Cadence® Spectre® Circuit Simulator as the simulator, and the transistor model was a Leti-UTSOI2 model.

Six separate simulations were performed. All sizing for the CTLE and LFE were kept constant for each simulation. The capacitors in the latches were kept constant. The width of the differential pair in the tap was constant, but the latches' differential pair width was increased when switching from taps using n-channel transistors (tap 10) to taps using p-channel transistors (taps 310 through 314) to account for the stronger pull-up of the p-channel transistors. Any additional power consumption this creates is reflected in the results. Only tap capacitors were set as variables in the simulations. Each simulation simulated the entire serializer device and the entire deserializer device with all taps in the two-tap ½-rate CS DFE employing the following taps:

| Simulation # | Taps used in ½-rate CS DFE |
|---|---|
| 1 | tap 10 (prior art) |
| 2 | tap 310 |
| 3 | tap 320 |
| 4 | tap 330 |
| 5 | tap 340 |
| 6 | tap 350 |

Figure 22:
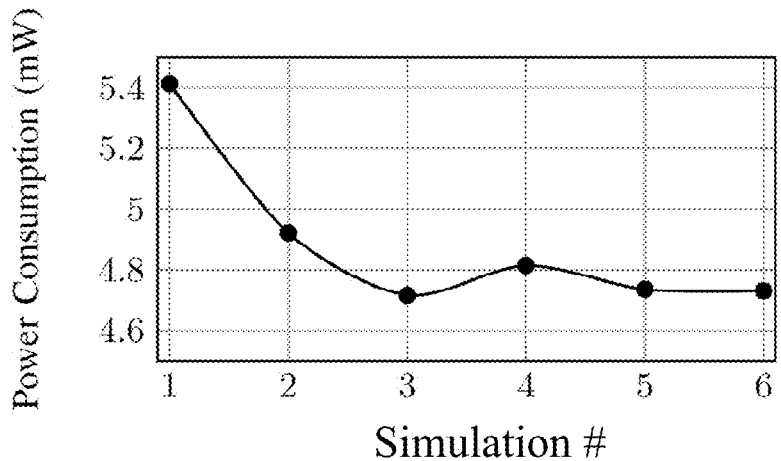
FIG. 22 is a graph of DFE power consumption for different types of taps.

FIG. 22 is a graph of DFE power consumption for different types of taps. Compared to using prior art taps, the power consumption in the DFE drops from 5.414 mW to as low as 4.717 mW. This corresponds to power savings of 12.8%.

Figure 23:
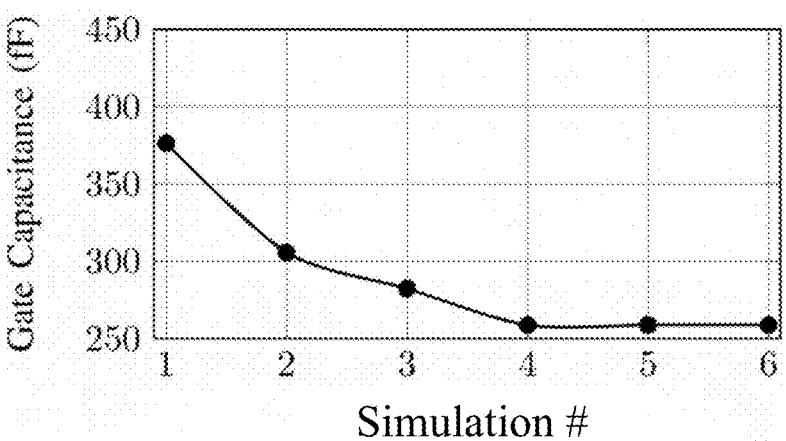
FIG. 23 is a graph of DFE switch gate capacitance for different types of taps.

FIG. 23 is a graph of DFE switch gate capacitance for different types of taps.

Figure 24:
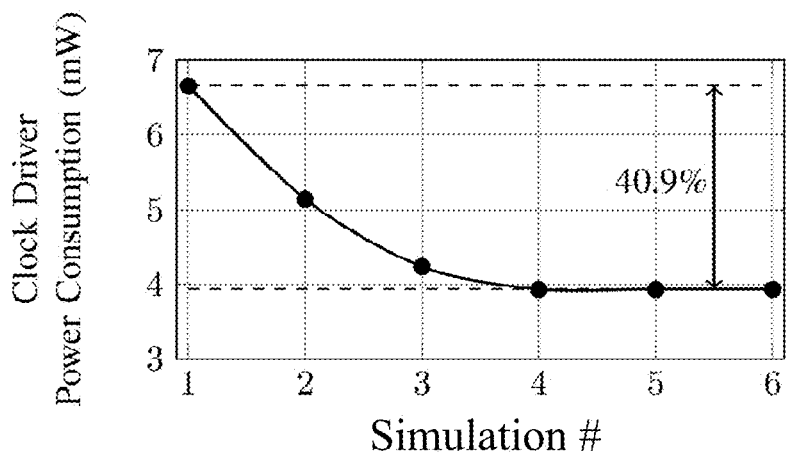
FIG. 24 is a graph of estimated clock driver power consumption for different types of taps.

FIG. 24 is a graph of estimated clock driver power consumption for different types of taps. Estimated clock buffer power dropped from 6.65 mW to 3.93 mW, corresponding to a power savings of 40.9%.

The scope of the claims is intended to encompass the following modifications to what has been described thus far, as well as any other modifications considered obvious to a person of ordinary skill in the art.

The DFE 100 is an example one-tap ½-rate CS DFE. Each branch of the DFE 100 comprises one input latch, a single pair of latches, and a single pair of taps. The DFE 200 is an example two-tap ½-rate CS DFE. Each branch of the DFE 200 comprises one input latch, two pairs of latches, and two pairs of taps. The new taps described in this document and illustrated in FIGS. 10, 11, 12, 13, 14, and 15 may be incorporated in a ½-rate CS DFE each branch of which has more than two pairs of latches and more than two pairs of taps. For example, a three-tap ½-rate CS DFE would comprise in its odd branch a pair of tertiary latches (one to sample the value held by the secondary latch L5 and the other to sample the value held by the secondary latch L6) and would comprises in its even branch another pair of tertiary latches (one to sample the value held by the secondary latch L7 and the other to sample the value held by the secondary latch L8). The three-tap ½-rate would comprise in its odd branch a pair of tertiary taps with coefficient $\alpha_3$ connected to the output of the tertiary latches in the even branch, and would comprise in its even branch a pair of tertiary taps with coefficient $\alpha_3$ connected to the output of the tertiary latches in the odd branch. Similar modifications could be made to achieve a four-tap ½-rate CS DFE, a five-tap ½-rate CS DFE, and so on.

This document refers to a first power supply rail and to a second power supply rail. In the examples described in this document, the first power supply rail supplies a voltage $V_{DD}$ and the second power supply rail is ground. In alternate implementations, the first power supply rail could be ground and the second power supply rail could supply the voltage $V_{DD}$.

In the examples described in this document, the latches use n-channel transistors and the taps use p-channel transistors. In alternate implementations, the latches could use p-channel transistors and the taps could use n-channel transistors. With these alternate implementations, references in this document to "drain node" should be changed to "source node", and references in this document to "source node" should be changed to "drain node".

A variable capacitor, also known as a tunable capacitor and as an adjustable capacitor, is a capacitor whose capacitance can be changed. The variable capacitors in the taps 310, 320, 340, and 350 have been illustrated as varactors. Any other suitable implementation of a variable capacitor is also contemplated. For example, the variable capacitors in the taps could be implemented as a bank of switched capacitors.

The new taps have been described in this document in the context of a CS DFE. However, the new taps could be employed in other contexts.

The scope of the claims should not be limited by the details set forth in the examples, but should be given the broadest interpretation consistent with the description as a whole.

What is claimed is:

1. A decision feedback equalizer comprising:
   a first charge-steering (CS) input latch and a second CS input latch, the first CS input latch and the second CS input latch driven by complementary ½-rate clocks;
   a first pair of CS primary latches connected to output nodes of the first CS input latch, the CS primary latches of the first pair driven by complementary in-phase ¼-rate clocks;
   a second pair of CS primary latches connected to output nodes of the second CS input latch, the CS primary latches of the second pair driven by complementary quadrature ¼-rate clocks;
   a first pair of taps, each tap of the first pair including a first differential pair of p-channel input transistors connected via their drain nodes to a differential pair of output nodes of the first CS input latch and connected via their source nodes to a differential pair of output nodes of a respective one of the second pair of CS primary latches; and
   a second pair of taps, each tap of the second pair including a second differential pair of p-channel input transistors connected via their drain nodes to a differential pair of output nodes of the second CS input latch and connected via their source nodes to a differential pair of output nodes of a respective one of the first pair of CS primary latches,
   wherein each one of the input latches and the primary latches includes a respective differential pair of n-channel output transistors.

2. The DFE as recited in claim 1, wherein no element of any one of the taps is driven by any ½-rate clock.

3. The DFE as recited in claim 1, wherein every switch of at least one of the taps is driven by one of the ¼-rate clocks.

4. The DFE as recited in claim 1, wherein each latch of the input latches and the primary latches includes a respective pair of switches connected to a first power supply rail ($V_{DD}$) and connected to drain nodes of the respective differential pair of n-channel output transistors of the latch, and at least one tap of the taps includes a switching circuit that connects source nodes of the differential pair of p-channel input transistors of the tap to the first power supply rail.

5. The DFE as recited in claim 4, wherein the switching circuit includes
   a reset switch connecting the first power supply rail to an intermediate node;
   an evaluation switch connecting the intermediate node to source nodes of the differential pair of p-channel input transistors of the tap; and
   a variable capacitor connected between the intermediate node and a second power supply rail,
   wherein the reset switch is driven by one of the ½-rate clocks and the evaluation switch is driven by one of the complementary in-phase ¼-rate clocks or one of the complementary quadrature ¼-rate clocks.

6. The DFE as recited in claim 4, wherein the switching circuit includes
   a reset switch connecting the first power supply rail to an intermediate node;
   an evaluation switch connecting the intermediate node to source nodes of the differential pair of p-channel input transistors of the tap; and
   a variable capacitor connected between the intermediate node and a second power supply rail,
   wherein the reset switch and the evaluation switch are driven by the complementary in-phase ¼-rate clocks or the complementary quadrature ¼-rate clocks.

7. The DFE as recited in claim 4, wherein the switching circuit includes a single switch driven by one of the complementary in-phase ¼-rate clocks or one of the complementary quadrature ¼-rate clocks, and gate nodes of the differential pair of p-channel input transistors of the tap are connected to a bulk bias voltage, wherein the single switch is driven by one of the complementary in-phase ¼-rate clocks or one of the complementary quadrature ¼-rate clocks.

8. The DFE as recited in claim 4, wherein the switching circuit includes
   a single switch connecting the first power supply rail to source nodes of the differential pair of p-channel input transistors of the tap; and a variable capacitor connected between a second power supply rail and the source nodes of the differential pair of p-channel input transistors of the tap, wherein the single switch is driven by one of the complementary in-phase ¼-rate clocks or one of the complementary quadrature ¼-rate clocks.

9. The DFE as recited in claim 4, wherein the switching circuit includes a single reset switch connecting the first power supply rail to source nodes of the differential pair of p-channel input transistors of the tap; and a variable capacitor connected between a second power supply rail and the source nodes of the differential pair of p-channel input transistors of the tap, wherein the single reset switch is driven by one of the complementary in-phase ¼-rate clocks or one of the complementary quadrature ¼-rate clocks, and the differential pair of p-channel input transistors of the tap act as a ¼-rate switch 180° out of phase with whichever clock drives the single reset switch.

10. The DFE as recited in claim 1, wherein each latch of the input latches and the primary latches includes a respective pair of switches connected to a first power supply rail ($V_{DD}$) and connected to drain nodes of the respective differential pair of n-channel output transistors of the latch, and for at least one tap of the taps:

source nodes of the differential pair of p-channel input transistors of the tap are directly connected to the first power supply rail, and gate nodes of the differential pair of p-channel input transistors of the tap are connected to a bulk bias voltage.

11. A decision feedback equalizer comprising:

a first charge-steering (CS) input latch and a second CS input latch, the first CS input latch and the second CS input latch driven by complementary ½-rate clocks;

a first pair of CS primary latches connected to output nodes of the first CS input latch, the CS primary latches of the first pair driven by complementary in-phase ¼-rate clocks;

a second pair of CS primary latches connected to output nodes of the second CS input latch, the CS primary latches of the second pair driven by complementary quadrature ¼-rate clocks;

a first pair of taps, each tap of the first pair including a first differential pair of n-channel output transistors connected via their source nodes to a differential pair of output nodes of the first CS input latch and connected via their drain nodes to a differential pair of output nodes of a respective one of the second pair of CS primary latches; and a second pair of taps, each tap of the second pair including a second differential pair of n-channel output transistors connected via their source nodes to a differential pair of output nodes of the second CS input latch and connected via their drain nodes to a differential pair of output nodes of a respective one of the first pair of CS primary latches, wherein each one of the input latches and the primary latches includes a respective differential pair of p-channel input transistors.

12. The DFE as recited in claim 11, wherein no element of any one of the taps is driven by any ½-rate clock.

13. The DFE as recited in claim 11, wherein every switch of at least one of the taps is driven by one of the ¼-rate clocks.

14. The DFE as recited in claim 11, wherein each latch of the input latches and the primary latches includes a respective pair of switches connected to a first power supply rail ($V_{DD}$) and connected to source nodes of the respective differential pair of p-channel input transistors of the latch, and at least one tap of the taps includes a switching circuit that connects drain nodes of the differential pair of n-channel output transistors of the tap to the first power supply rail.

15. The DFE as recited in claim 14, wherein the switching circuit includes a reset switch connecting the first power supply rail to an intermediate node;

an evaluation switch connecting the intermediate node to drain nodes of the differential pair of n-channel output transistors of the tap; and a variable capacitor connected between the intermediate node and a second power supply rail, wherein the reset switch is driven by one of the ½-rate clocks and the evaluation switch is driven by one of the complementary in-phase ¼-rate clocks or one of the complementary quadrature ¼-rate clocks.

16. The DFE as recited in claim 14, wherein the switching circuit includes a reset switch connecting the first power supply rail to an intermediate node;

an evaluation switch connecting the intermediate node to drain nodes of the differential pair of n-channel output transistors of the tap; and a variable capacitor connected between the intermediate node and a second power supply rail, wherein the reset switch and the evaluation switch are driven by the complementary in-phase ¼-rate clocks or the complementary quadrature ¼-rate clocks.

17. The DFE as recited in claim 14, wherein the switching circuit includes a single switch driven by one of the complementary in-phase ¼-rate clocks or one of the complementary quadrature ¼-rate clocks, and gate nodes of the differential pair of n-channel output transistors of the tap are connected to a bulk bias voltage, wherein the single switch is driven by one of the complementary in-phase ¼-rate clocks or one of the complementary quadrature ¼-rate clocks.

18. The DFE as recited in claim 14, wherein the switching circuit includes a single switch connecting the first power supply rail to drain nodes of the differential pair of n-channel output transistors of the tap; and a variable capacitor connected between a second power supply rail and the drain nodes of the differential pair of n-channel output transistors of the tap, wherein the single switch is driven by one of the complementary in-phase ¼-rate clocks or one of the complementary quadrature ¼-rate clocks.

19. The DFE as recited in claim 14, wherein the switching circuit includes a single reset switch connecting the first power supply rail to drain nodes of the differential pair of n-channel output transistors of the tap; and a variable capacitor connected between a second power supply rail and the drain nodes of the differential pair of n-channel output transistors of the tap, wherein the single reset switch is driven by one of the complementary in-phase ¼-rate clocks or one of the complementary quadrature ¼-rate clocks, and the differential pair of n-channel output transistors of the tap act as a ¼-rate switch 180° out of phase with whichever clock drives the single reset switch.

20. The DFE as recited in claim 11, wherein each latch of the input latches and the primary latches includes a respective pair of switches connected to a first power supply rail ($V_{DD}$) and connected to source nodes of the respective differential pair of p-channel input transistors of the latch, and for at least one tap of the taps:
- drain nodes of the differential pair of n-channel output transistors of the tap are directly connected to the first power supply rail, and
- gate nodes of the differential pair of n-channel output transistors of the tap are connected to a bulk bias voltage.

* * * * *